(12) United States Patent
Melde et al.

(10) Patent No.: US 12,557,330 B2
(45) Date of Patent: Feb. 17, 2026

(54) SEMICONDUCTOR DEVICE INCLUDING GATE WITH DIFFERENT LATERALLY ADJACENT SECTIONS AND METHOD

(71) Applicant: GlobalFoundries U.S. Inc., Malta, NY (US)

(72) Inventors: Thomas Melde, Dresden (DE); Ralf Richter, Dresden (DE); Stefan Dünkel, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 456 days.

(21) Appl. No.: 18/127,041

(22) Filed: Mar. 28, 2023

(65) Prior Publication Data

US 2024/0332417 A1 Oct. 3, 2024

(51) Int. Cl.
| | |
|---|---|
| H01L 29/78 | (2006.01) |
| H10D 30/01 | (2025.01) |
| H10D 30/65 | (2025.01) |
| H10D 62/10 | (2025.01) |
| H10D 62/17 | (2025.01) |
| H10D 64/01 | (2025.01) |
| H10D 64/27 | (2025.01) |

(52) U.S. Cl.
CPC ......... *H10D 30/65* (2025.01); *H10D 30/0281* (2025.01); *H10D 62/116* (2025.01); *H10D 62/393* (2025.01); *H10D 64/01* (2025.01); *H10D 64/516* (2025.01); *H10D 64/518* (2025.01)

(58) Field of Classification Search
None
See application file for complete search history.

(56) References Cited

U.S. PATENT DOCUMENTS

| | | | |
|---|---|---|---|
| 4,649,627 | A | 3/1987 | Abernathey et al. |
| 5,095,344 | A | 3/1992 | Harari |
| 8,822,291 | B2 | 9/2014 | Zhang et al. |
| 8,878,275 | B2 | 11/2014 | Kim et al. |

(Continued)

OTHER PUBLICATIONS

U.S. Appl. No. 17/701,751, Office Action dated Jun. 8, 2023, 14 pages.

(Continued)

*Primary Examiner* — William C Trapanese
(74) *Attorney, Agent, or Firm* — Francois Pagette; Hoffman Warnick LLC

(57) ABSTRACT

Disclosed are embodiments of a semiconductor device and method of forming the device. The device includes a gate with first and second sections on a semiconductor layer. The first section includes first gate dielectric and gate conductor layers and an optional additional gate conductor layer on the first gate conductor layer. The second section includes second gate dielectric and gate conductor layers on the semiconductor layer and further extending onto the top of the first gate conductor layer. The second gate dielectric layer is thinner than the first gate dielectric layer. A gate sidewall spacer is on the first gate conductor layer positioned laterally to a sidewall of the second section (e.g., between the sidewall and the optional additional gate conductor layer). The first and second sections are either electrically connected for biasing with the gate bias voltage or electrically isolated for biasing with different gate bias voltages.

20 Claims, 25 Drawing Sheets

(56) References Cited

U.S. PATENT DOCUMENTS

| | | | |
|---|---|---|---|
| 10,032,902 | B2 | 7/2018 | Toh et al. |
| 10,283,622 | B1 | 5/2019 | Zhang |
| 2012/0211812 | A1 | 8/2012 | Du et al. |
| 2013/0277741 | A1 | 10/2013 | Guowei et al. |
| 2017/0040422 | A1 | 2/2017 | Jung et al. |
| 2017/0148911 | A1 | 5/2017 | Chou et al. |
| 2017/0194490 | A1 | 7/2017 | Li et al. |
| 2019/0386134 | A1* | 12/2019 | Kim ..................... H10D 62/153 |
| 2020/0335623 | A1 | 10/2020 | Shin et al. |
| 2021/0359130 | A1 | 11/2021 | Jain et al. |

OTHER PUBLICATIONS

Anonymous, "3.2.2 Hot Carrier Effect in LDMOSFETs," retrieved from: https://www.iue.tuwien.ac.at/phd/park/node38.html, Accessed on Nov. 19, 2021, pp. 1-4.

Lin et al., "A New Solution for Superjunction Lateral Double Diffused MOSFET by Using Deep Drain Diffusion and Field Plates," IEEE Electron Device Letters, vol. 36, No. 6, 2015, pp. 558-590.

Sharma et al., "Integrated 85V Rated Complimentary LDMOS Devices Utilizing Patterned Field Plate Structures for Best-in-Class Performance in Network Communication Applications," IEEE, 25th International Symposium on Power Semiconductor Devices & IC's (ISPSD), 2013, pp. 365-368.

European Search Report for corresponding EP Application No. 23198447.7-1212 dated Mar. 15, 2024, 9 pages.

* cited by examiner

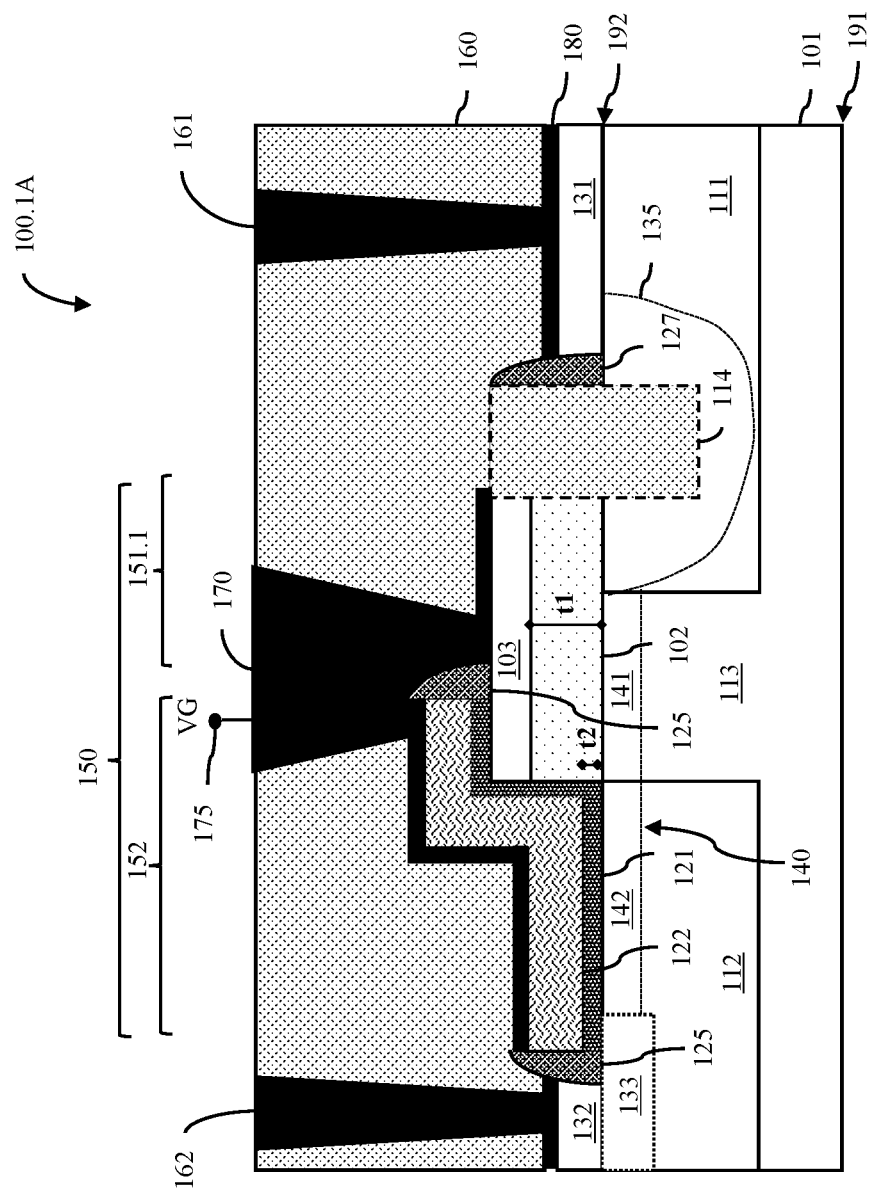
FIG. 1.1A

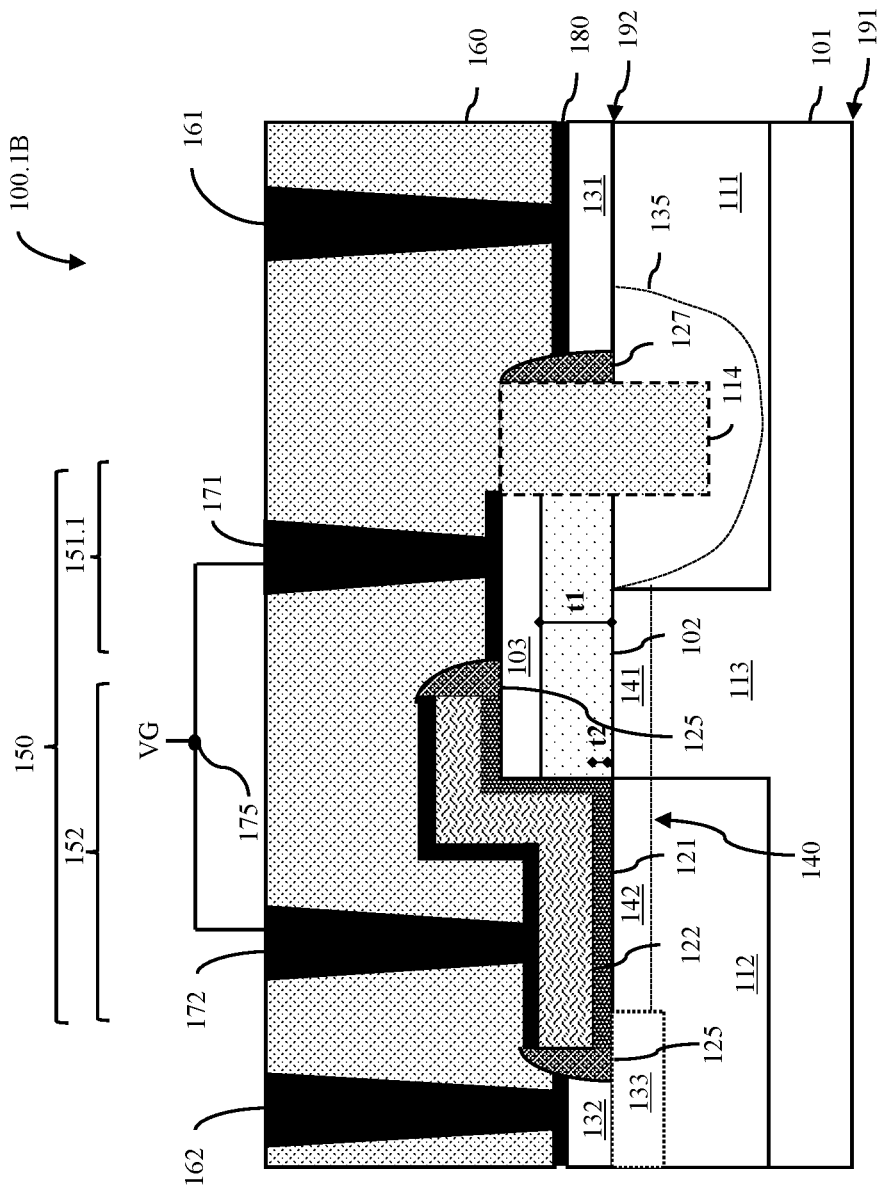
FIG. 1.1B

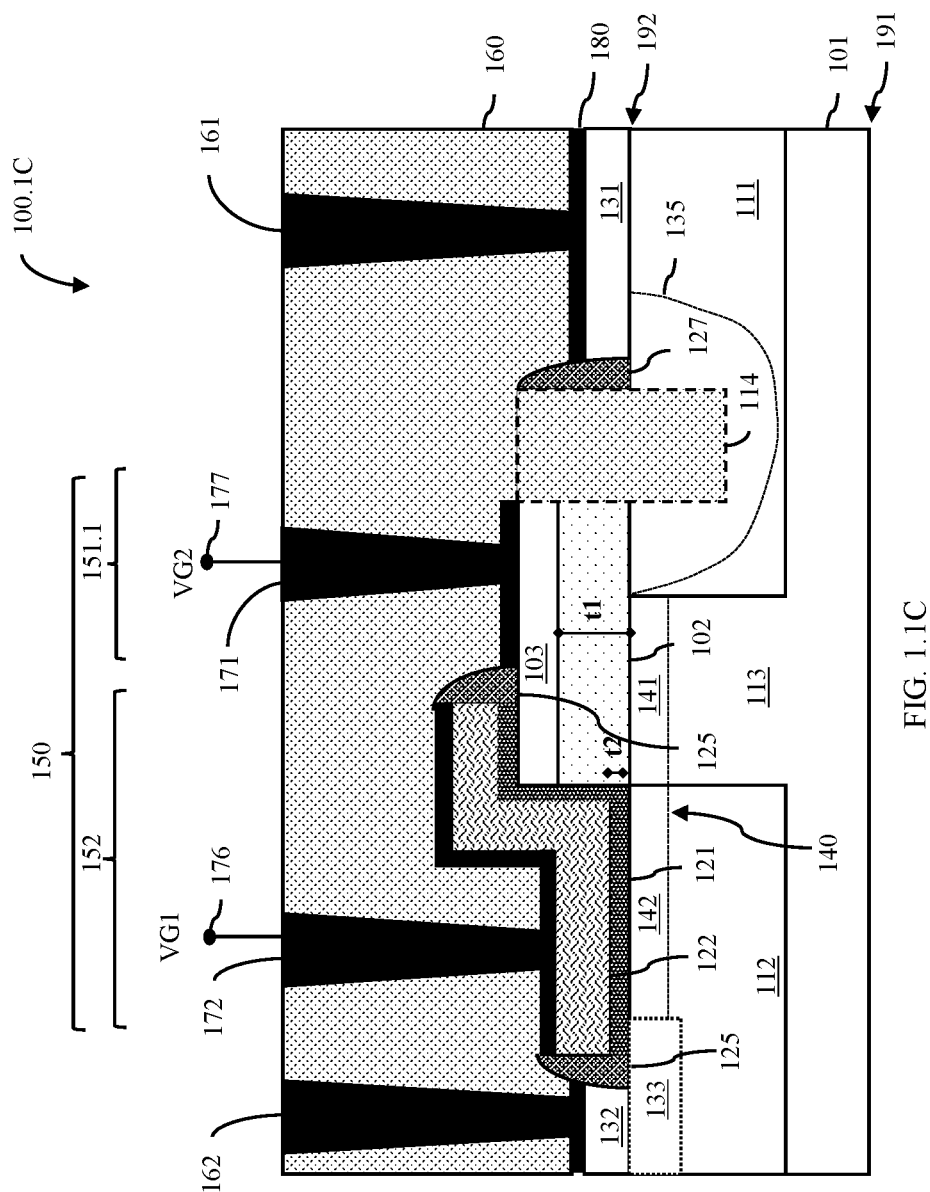
FIG. 1.1C

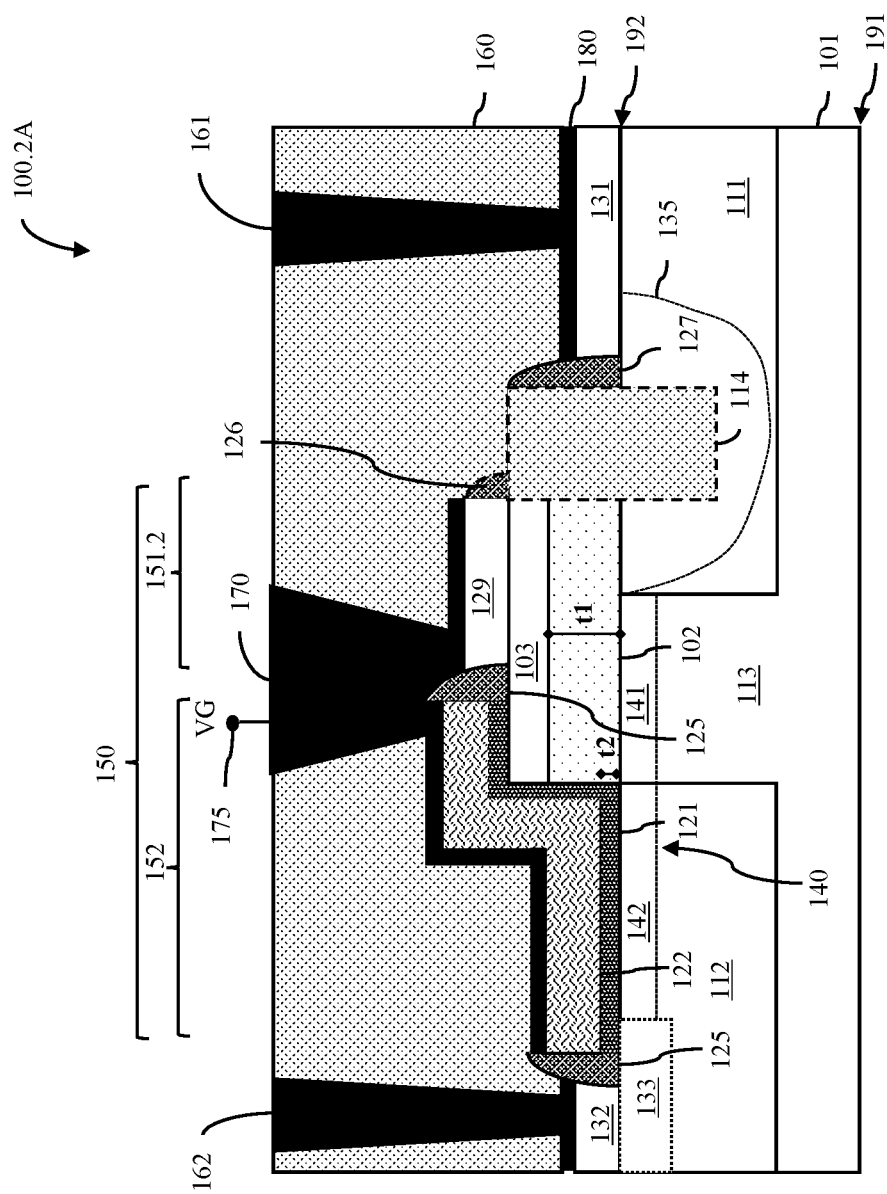
FIG. 1.2A

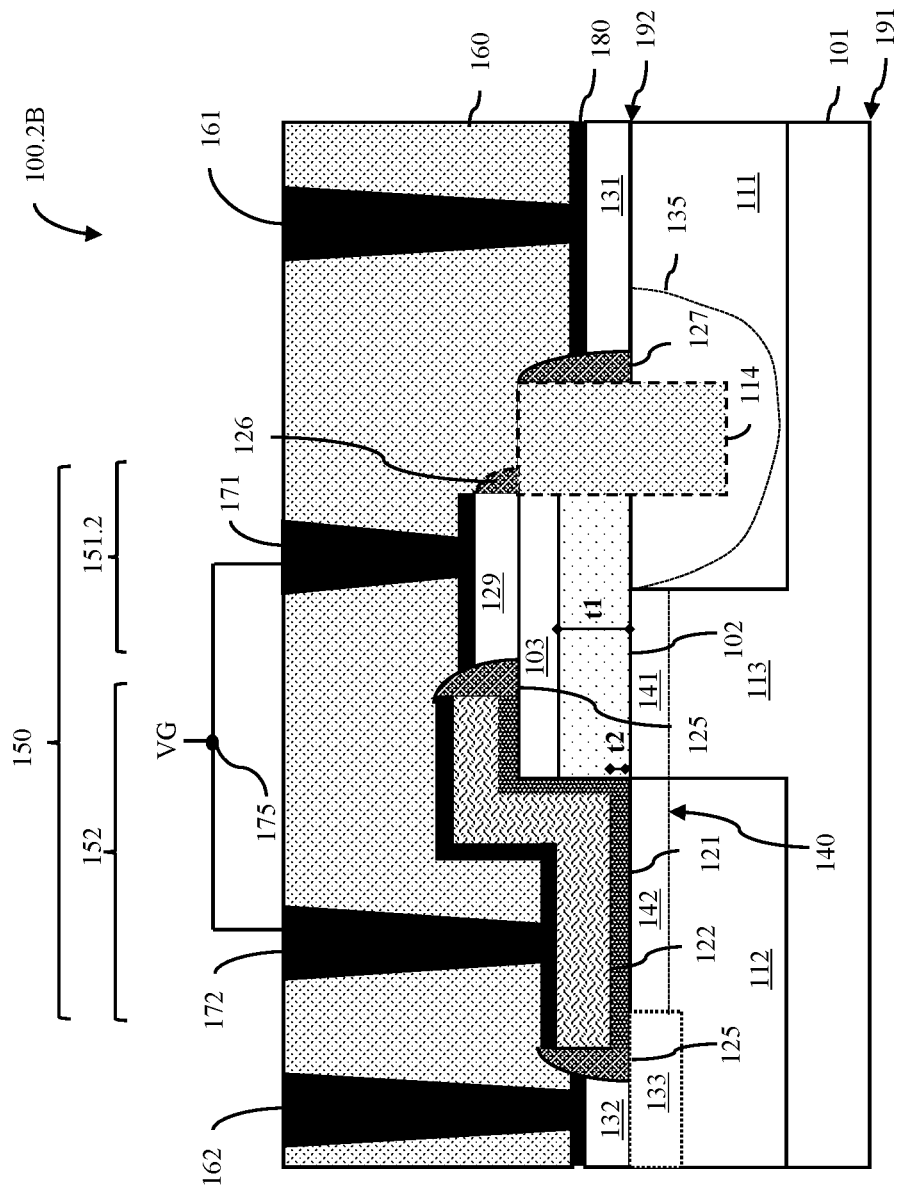
FIG. 1.2B

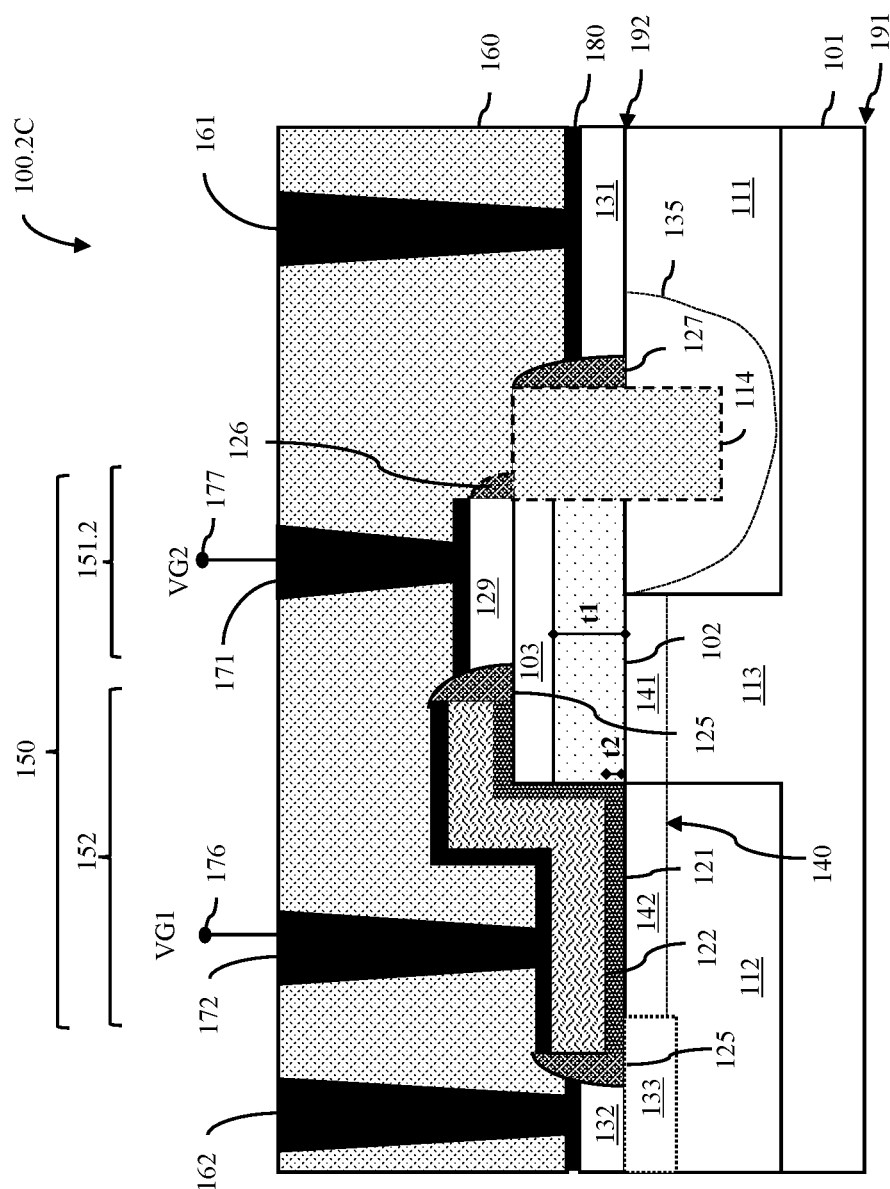
FIG. 1.2C

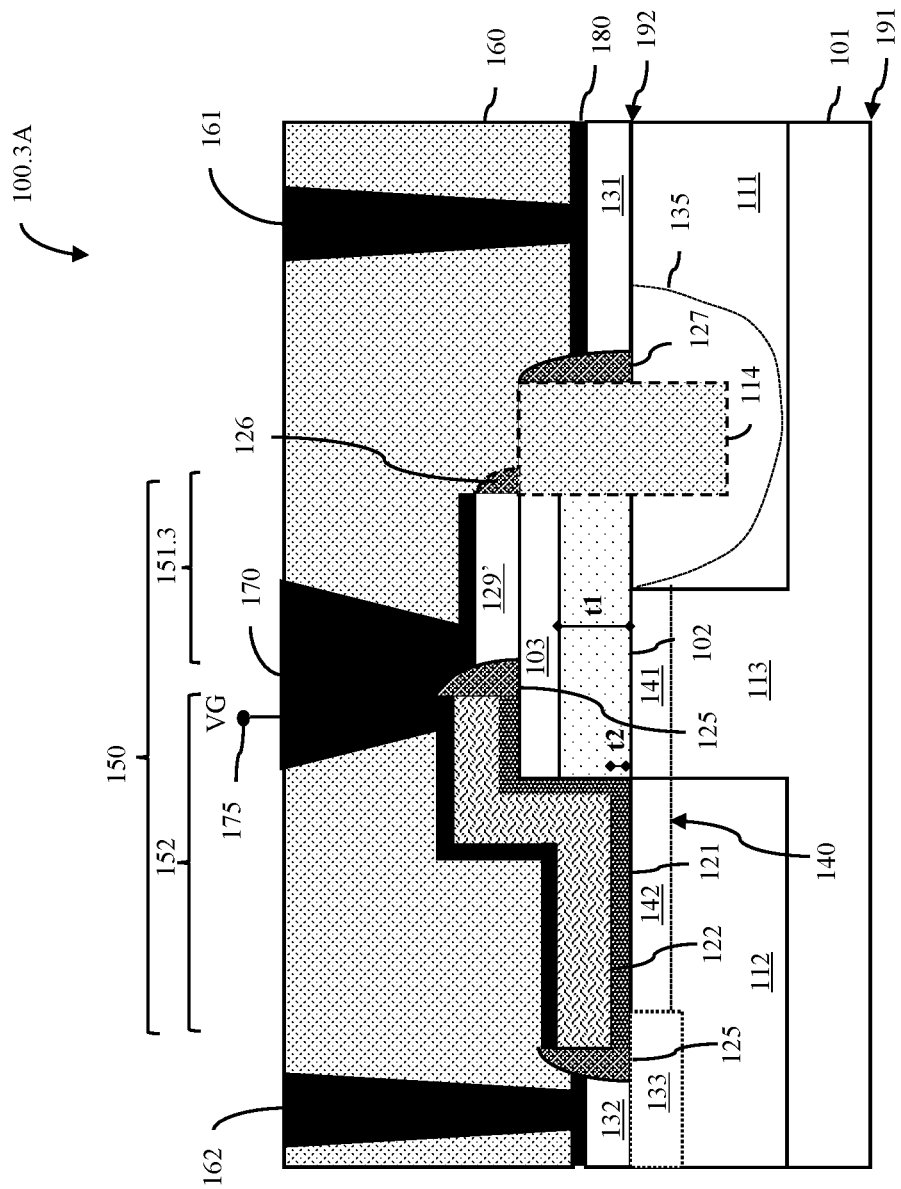
FIG. 1.3A

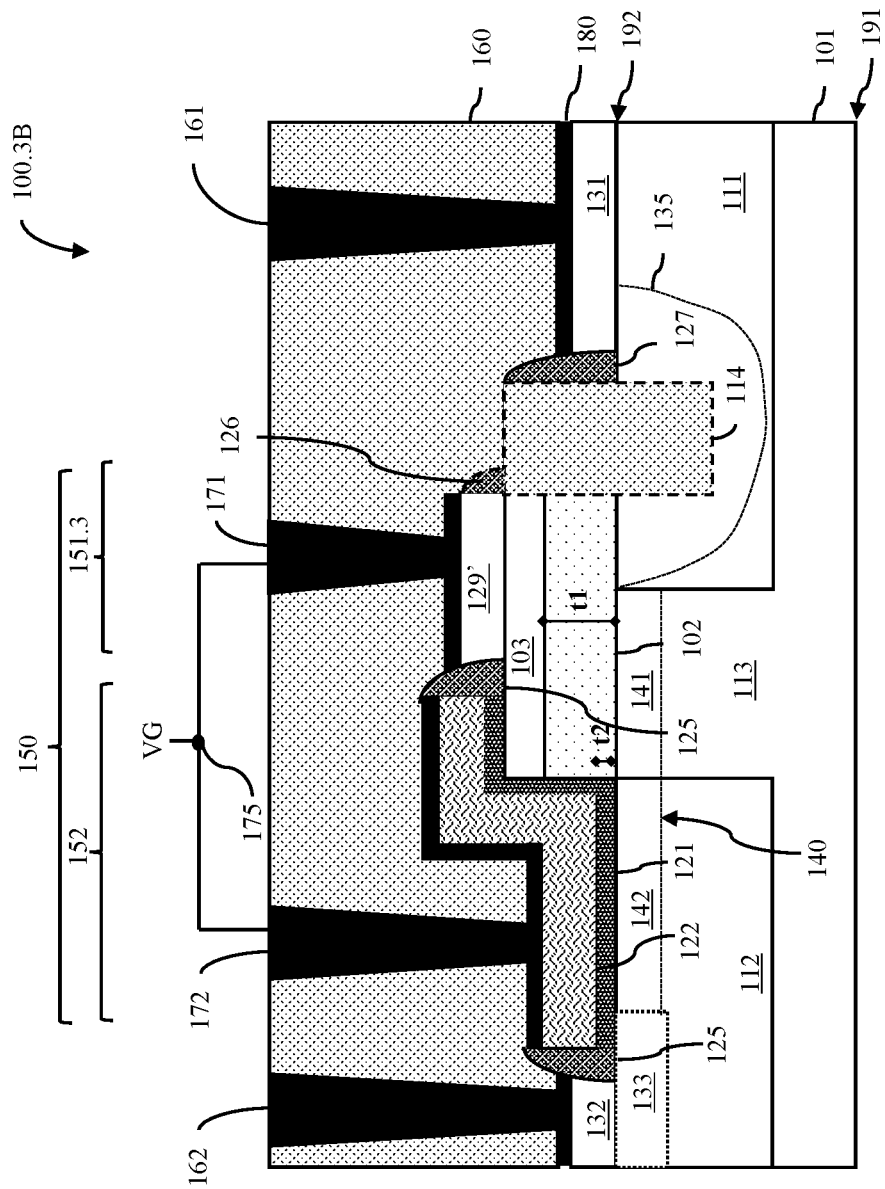
FIG. 1.3B

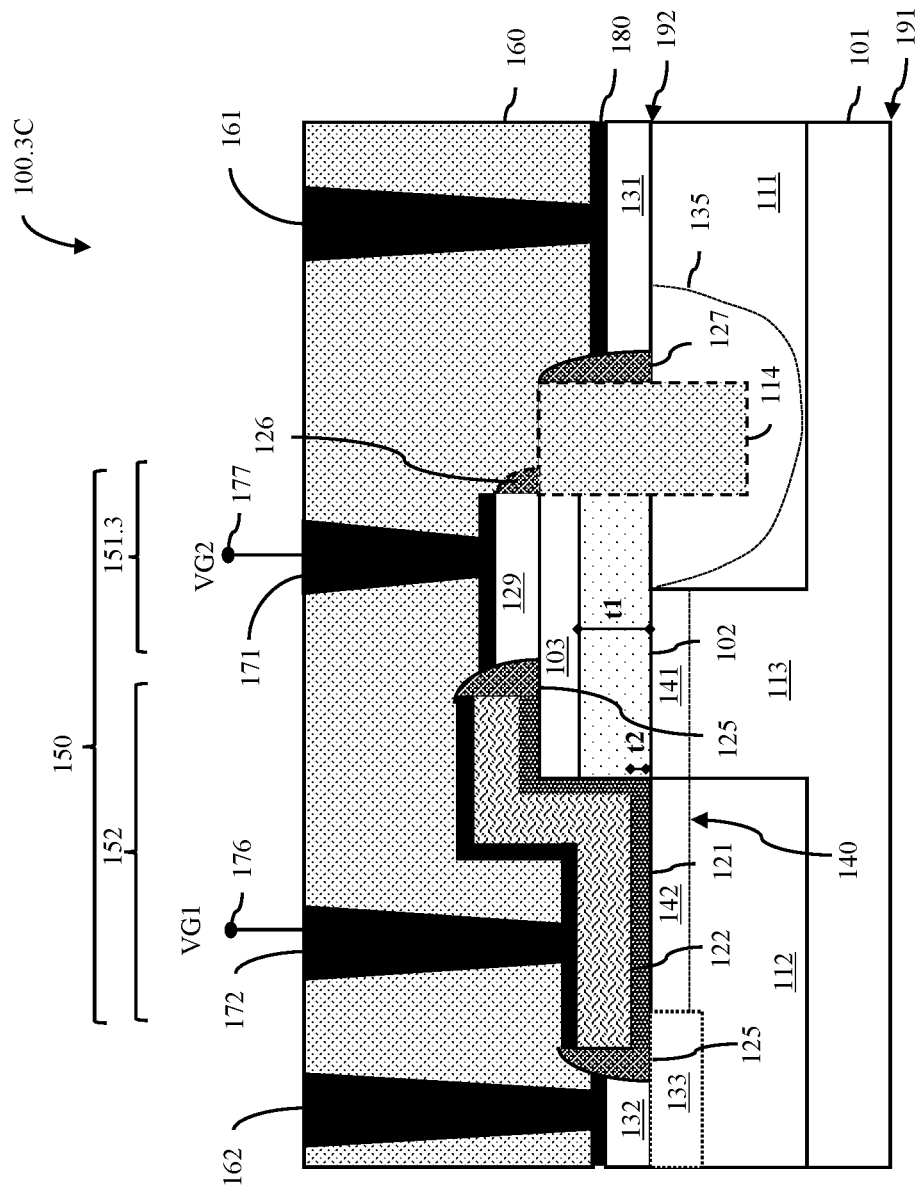
FIG. 1.3C

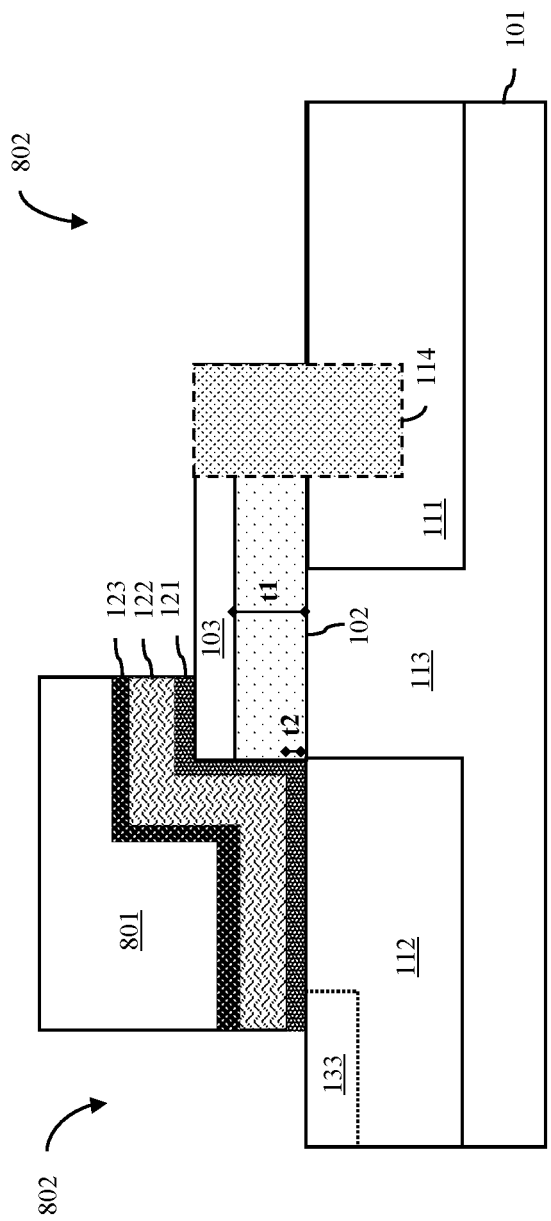
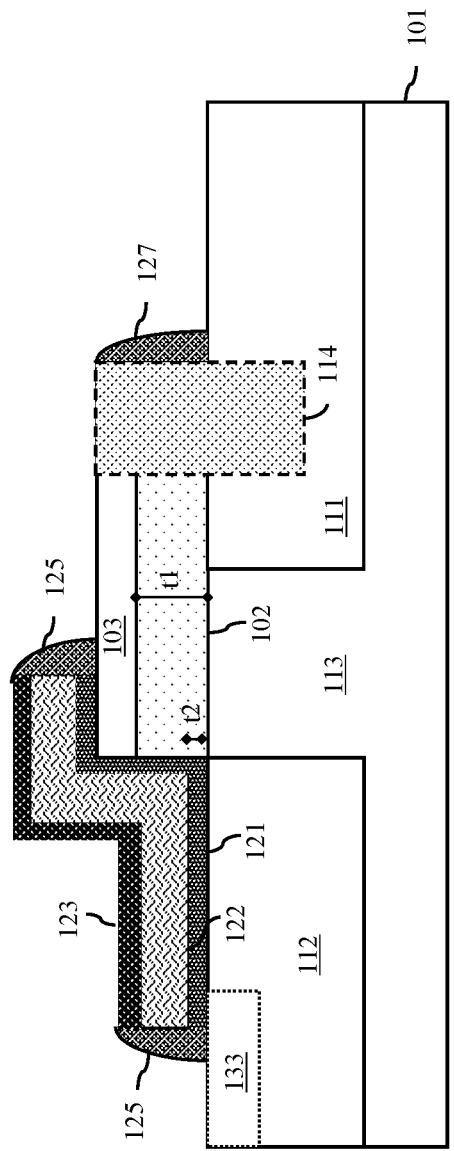
FIG. 9
FIG. 10

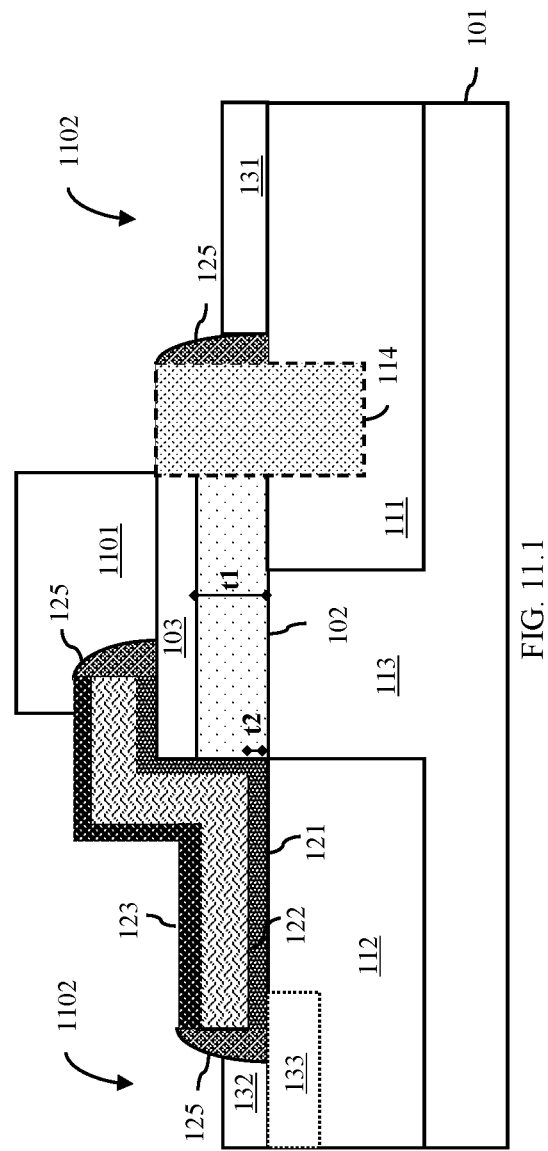
FIG. 11.1

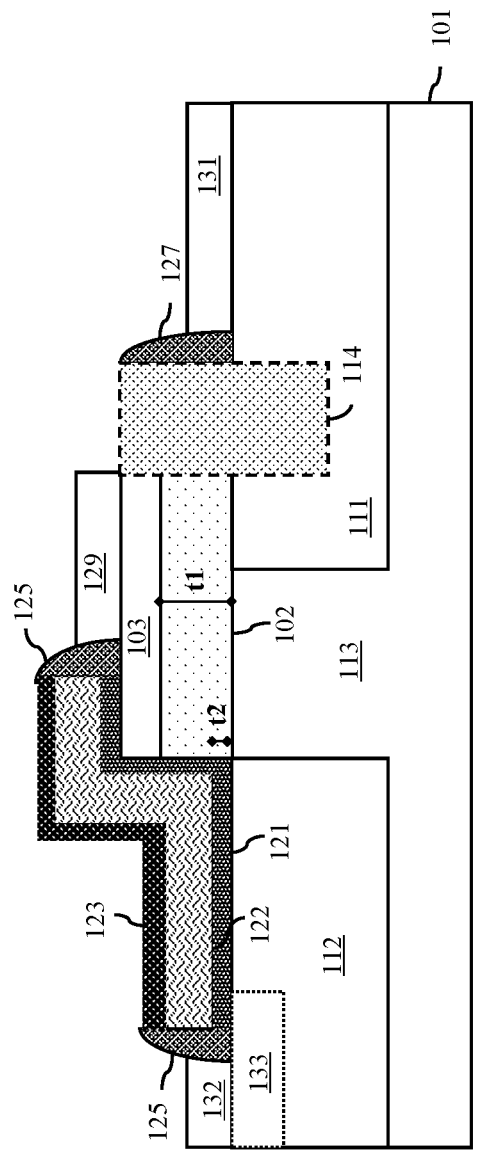
FIG. 11.2

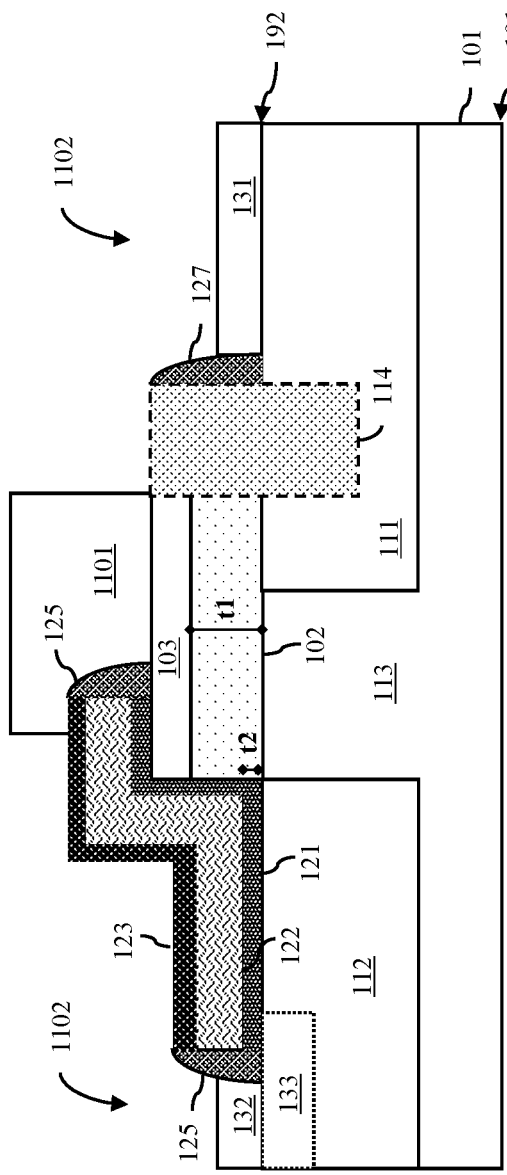
FIG. 11.3a
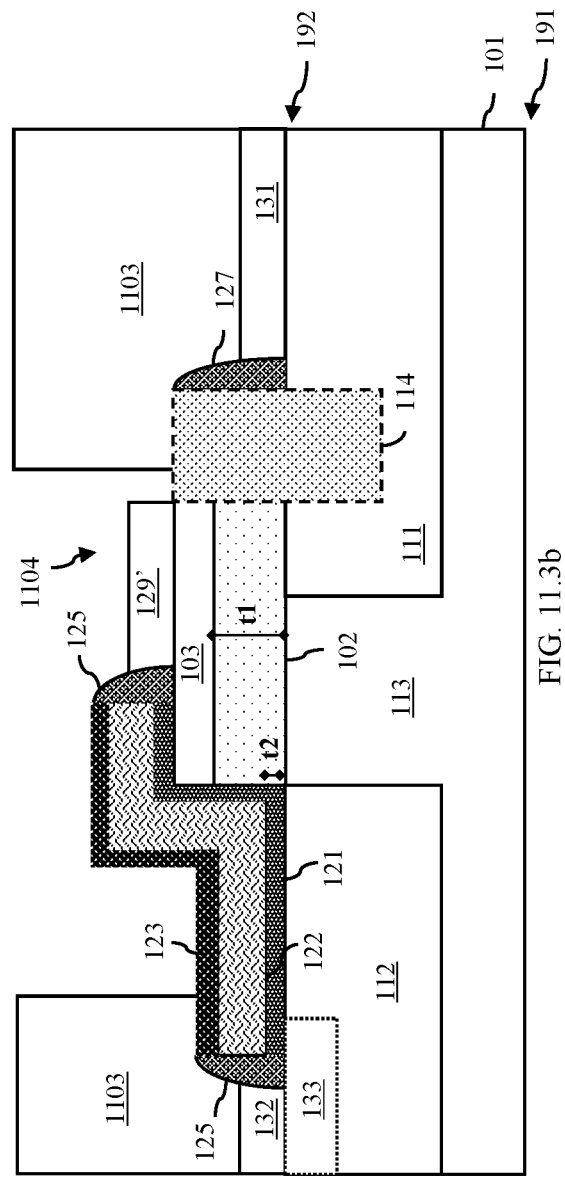
FIG. 11.3b

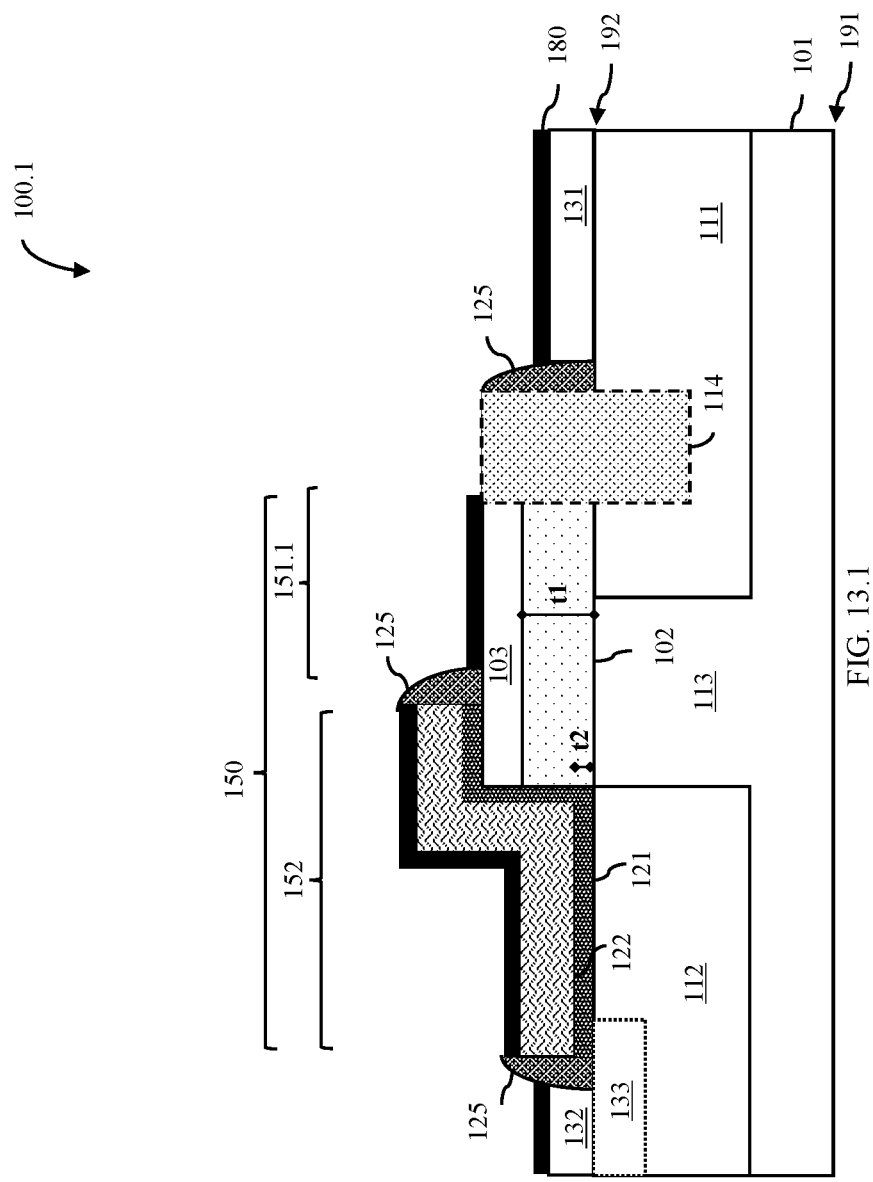
FIG. 13.1

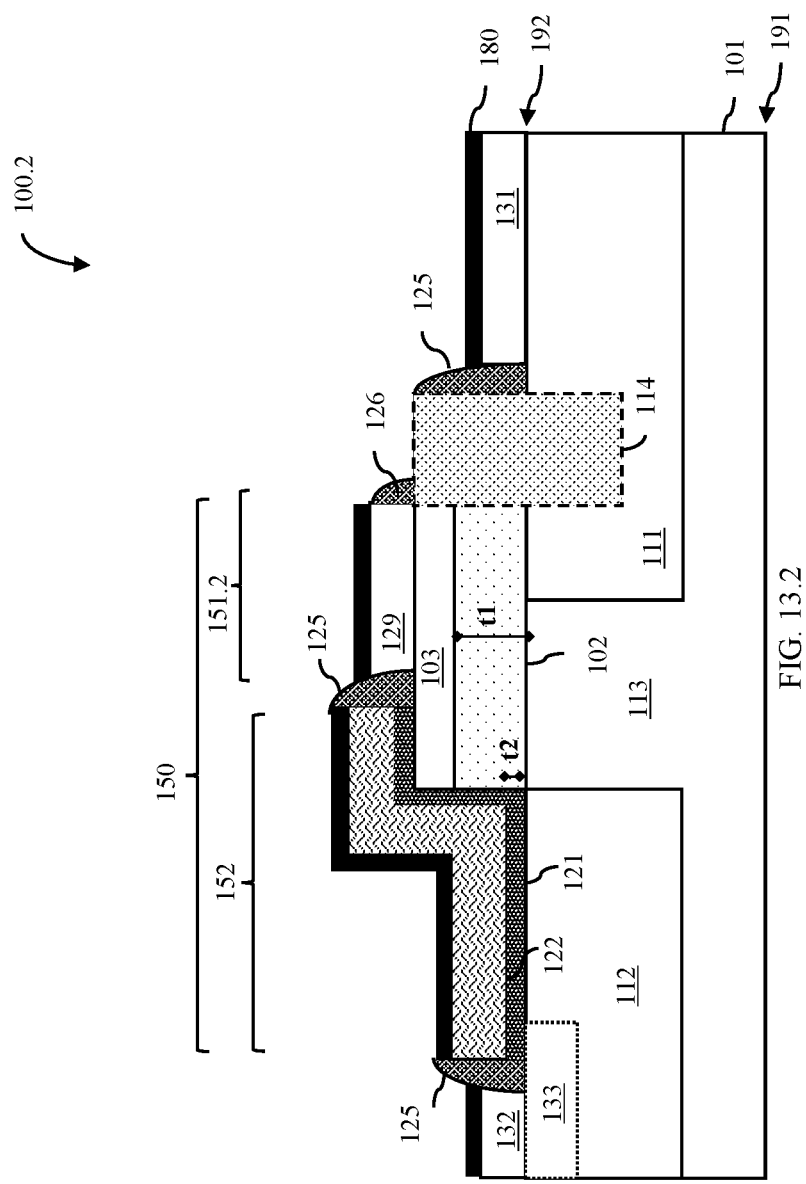
FIG. 13.2

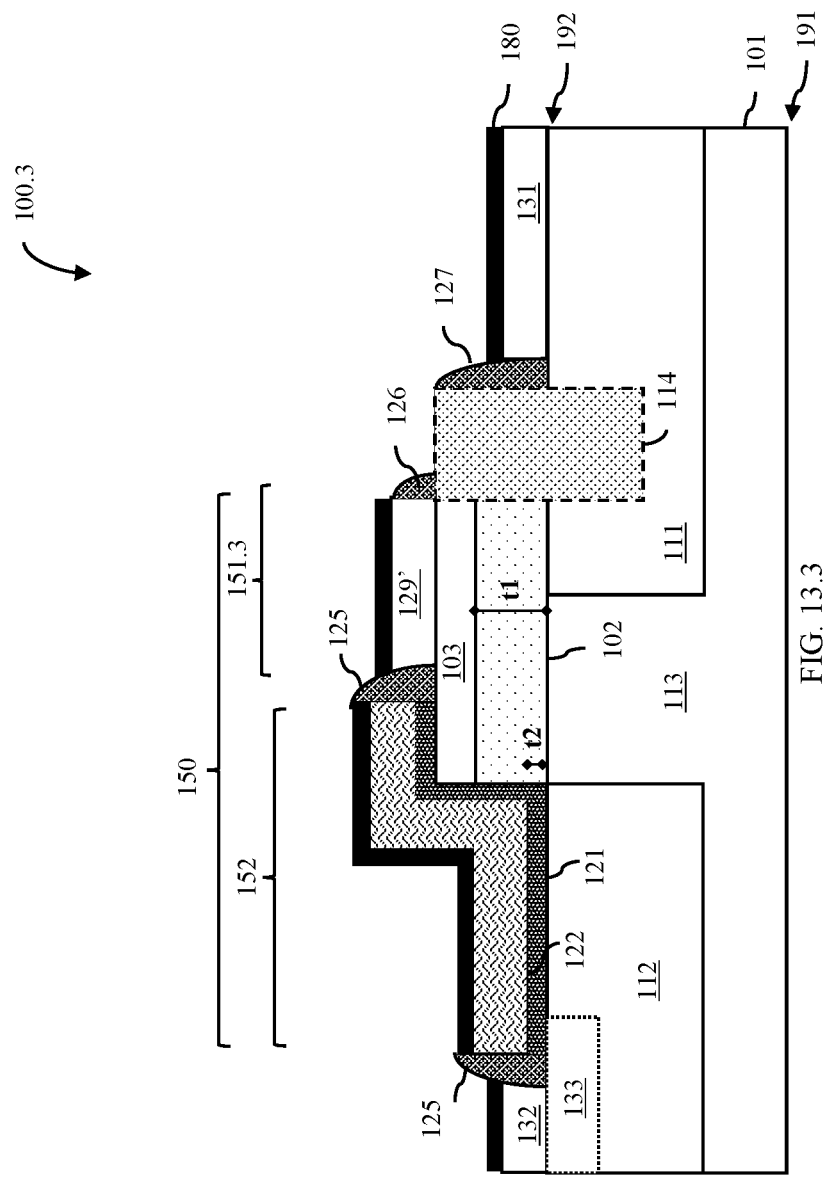
FIG. 13.3

SEMICONDUCTOR DEVICE INCLUDING GATE WITH DIFFERENT LATERALLY ADJACENT SECTIONS AND METHOD

BACKGROUND

The present disclosure relates to semiconductor devices and, more particularly, to embodiments of a semiconductor device (e.g., a laterally diffused metal oxide semiconductor field effect transistor (LDMOSFET)) and to embodiments of a method of forming the semiconductor device.

Factors considered in modern integrated circuit (IC) design include, but are not limited to, performance improvement, size scaling, and power consumption. Oftentimes, however, there is a tradeoff between these factors. For example, LDMOSFETs are widely used in power amplifiers, such as radio-frequency (RF) amplifiers, microwave power amplifiers, etc. because of their low on-resistance and because, in general, they have a relatively high blocking voltage (also referred to in the art as the drain-to-source breakdown voltage (BVdss)). However, with device size scaling and operation at higher voltages, LDMOSFETs can exhibit performance degradation including (but not limited to) reduced BVdss and reduced transconductance (Gm). BVdss refers to the specific drain-to-source voltage (Vds) that results in the transistor entering the breakdown region at which Vds is too high and the drain current (Id) spikes (i.e., increases dramatically). Gm refers to the ratio of the change in Id to the change in gate voltage (Vg) (i.e., Id2–Id1/Vg2–Vg1) over, for example, some period of time in the I/V curve for the device.

SUMMARY

Disclosed herein are embodiments of a semiconductor device. The semiconductor device can include a semiconductor layer. The semiconductor device can further include a gate. The gate can include two sections (i.e., a first gate section and a second gate section). The first gate section can include a first gate dielectric layer on the semiconductor layer and a first gate conductor layer on the first gate dielectric layer. The second gate section can include a second gate dielectric layer, which is on the semiconductor layer and extends onto the first gate conductor layer, and a second gate conductor layer, which is on the second gate dielectric layer. The second gate dielectric layer can specifically be thinner than the first gate dielectric layer. The semiconductor device can further include a gate sidewall spacer, which is on the top surface of the first gate conductor layer of the first gate section and which is positioned laterally adjacent the second gate dielectric layer and the second gate conductor layer of the second gate section.

In some embodiments, the first gate section can include an additional gate conductor layer. More particularly, in some embodiment, the semiconductor device can include a semiconductor layer. The semiconductor device can further include a gate with two sections (i.e., a first gate section and a second gate section). The first gate section can include: a first gate dielectric layer on the semiconductor layer; a first gate conductor layer on the first gate dielectric layer; and an additional gate conductor layer on the first gate conductor layer. The second gate section can include: a second gate dielectric layer on the semiconductor layer and further extending onto the first gate conductor layer; and a second gate conductor layer on the second gate dielectric layer. Again, the second gate dielectric layer can be thinner than the first gate dielectric layer. The semiconductor device can further include gate sidewall spacer, which is on the first gate conductor layer of the first gate section, and which is further positioned laterally between the second gate dielectric layer and the second gate conductor layer of the second gate section and the additional gate conductor layer of the first gate section.

Also disclosed herein are method embodiments for forming the semiconductor device embodiments. For example, a method embodiment can include providing a semiconductor layer. The method can further include forming a semiconductor device including the semiconductor layer. Specifically, the semiconductor device can be formed so that it includes a gate with two sections (i.e., a first gate section and a second gate section). The first gate section can include a first gate dielectric layer on the semiconductor layer and a first gate conductor layer on the first gate dielectric layer. The second gate section can include a second gate dielectric layer on the semiconductor layer and further extending onto the first gate conductor layer and a second gate conductor layer on the second gate dielectric layer. The second gate dielectric layer can specifically be thinner than the first gate dielectric layer. The semiconductor device can further include a gate sidewall spacer, which is on the top surface of the first gate conductor layer of the first gate section and which is positioned laterally adjacent the second gate dielectric layer and the second gate conductor layer of the second gate section.

BRIEF DESCRIPTION OF THE DRAWINGS

The present disclosure will be better understood from the following detailed description with reference to the drawings, which are not necessarily drawn to scale and in which:

FIGS. 1.1A-1.1C are cross-section illustrations of embodiments of a semiconductor device;

FIGS. 1.2A-1.2C are cross-section illustrations of additional embodiments of a semiconductor device;

FIGS. 1.3A-1.3C are cross-section illustrations of additional embodiments of a semiconductor device;

FIGS. 2-10 are cross-section illustrations of partially completed semiconductor structures formed according to disclosed method embodiments for forming any of the structures shown in FIGS. 1.1A-1.3C;

FIG. 11.1 is a cross-section illustration of a partially completed semiconductor structure formed according to a method embodiment for forming the structure shown in FIGS. 1.1A-1.1C;

FIG. 11.2 is a cross-section illustration of a partially completed semiconductor structure formed according to a method embodiment for forming the structure shown in FIGS. 1.2A-1.2C;

FIGS. 11.3a-11.3b are cross-section illustrations of partially completed semiconductor structure formed according to a method embodiment for forming the structure shown in FIGS. 1.3A-1.3C;

FIG. 13.1 is a cross-section illustration of a partially completed semiconductor structure formed according to a method embodiment for forming the structure shown in FIGS. 1.1A-1.1C;

FIG. 13.2 is a cross-section illustration of a partially completed semiconductor structure formed according to a method embodiment for forming the structure shown in FIGS. 1.2A-1.2C;

FIG. 13.3 is a cross-section illustration of a partially completed semiconductor structure formed according to a method embodiment for forming the structure shown in FIGS. 1.3A-1.3C;

DETAILED DESCRIPTION

Figure 2:
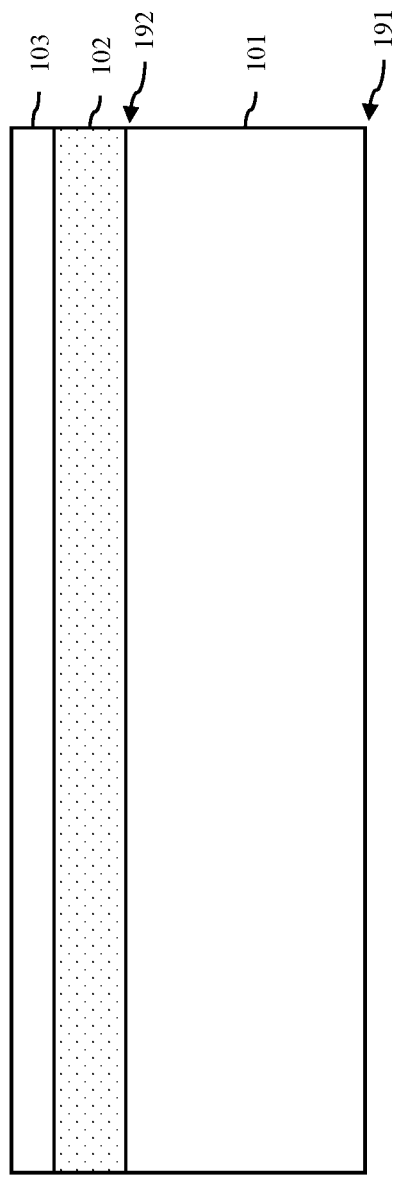

As mentioned above, factors considered in modern IC design include, but are not limited to, performance improvement, size scaling, and power consumption. Oftentimes, however, there is a tradeoff between these factors. For example, LDMOSFETs are widely used in power amplifiers, such as radio-frequency (RF) amplifiers, microwave power amplifiers, etc. because of their low on-resistance and because, in general, they have a relatively high blocking voltage (also referred to in the art as the drain-to-source breakdown voltage (BVdss)). However, with device size scaling and operation at higher voltages, LDMOSFETs can exhibit performance degradation including, but not limited to, reduced BVdss and reduced transconductance (Gm).

In view of the foregoing disclosed herein are embodiments of a semiconductor device (e.g., an LDMOSFET). In each of the embodiments, the device can include a semiconductor layer and a gate with first and second gate sections. The first gate section can include stacked first gate dielectric and gate conductor layers. In some embodiments, these layers can be patterned from a semiconductor-on-insulator region of a hybrid substrate (e.g., the first gate dielectric layer can be a buried oxide layer and the first gate conductor layer can be a monocrystalline semiconductor layer). Optionally, the first gate section can also include an additional gate conductor layer on the first gate conductor layer. The second gate section can include stacked second gate dielectric and gate conductor layers on the semiconductor layer positioned laterally adjacent to the first gate section and further extending onto the top of the first gate conductor layer. The second gate dielectric layer can specifically be thinner than the first gate dielectric layer. A gate sidewall spacer can be on the first gate conductor layer positioned laterally adjacent to a sidewall of the second gate section. The gate sidewall spacer may be immediately adjacent to essentially vertical surfaces of the second gate dielectric and gate conductor layers above the first gate conductor layer. In embodiments where the first gate section includes an additional gate conductor layer, the gate sidewall spacer can be positioned laterally between and immediately adjacent to the sidewall of the second gate section and the additional gate conductor layer of the first gate section. In some embodiments, the first and second gate sections can be electrically connected for biasing by the same gate bias voltage source. In other embodiments, the first and second gate sections can be electrically isolated for biasing by different gate bias voltage sources. In any case, the presence of the first gate section with the relatively thick gate dielectric layer can improve BVdss and Gm of the LDMOSFET and, thereby improve operation at higher voltages. Also disclosed herein are method embodiments for forming the semiconductor device.

FIGS. 1.1A-1.3C are cross-section illustrations of embodiments of a semiconductor device 100.1A-100.3C, respectively. As discussed in greater detail below, in each of these embodiments the semiconductor device 100.1A-100.3C can be, for example, an LDMOSFET with a gate 150 having multiple sections including a section with a relatively thick gate dielectric layer to improve operation at high voltages.

Referring to FIGS. 1.1A-1.3C, each embodiment of semiconductor device 100.1A-100.3C can include a semiconductor layer 101 having a first surface 191 (i.e., a bottom surface) and a second surface 192 (i.e., a top surface) opposite the first surface 191. In some embodiments, the semiconductor layer 101 could be a semiconductor substrate (e.g., a silicon (Si) substrate or a substrate of any other suitable semiconductor material, such as germanium (Ge), silicon germanium (SiGe), etc.) of a semiconductor-on-insulator structure (e.g., a silicon-on-insulator (SOI) structure). For example, as discussed in detail below with regard to the method embodiments, the semiconductor device could be formed at an advanced SOI technology node, such as a fully depleted SOI technology node, and which includes bulk and SOI regions). In general (except for wells and other doped regions, discussed below), the semiconductor layer 101 can, for example, be doped with a P-type dopant so as to have P-type conductivity at a relatively low conductivity level (e.g., so as to be a P-semiconductor layer). See the detailed discussion below regarding semiconductor material doping to achieve different conductivity types and levels.

The semiconductor device 100.1A-100.3C can have an active device region in semiconductor layer 101. Although not shown, boundaries of the active device region could, for example, be defined by shallow trench isolation (STI) structures external to the device. That is, external STI structures could extend into semiconductor layer 101 from the second surface 192 so as to laterally surround and thereby define the boundaries of the active device region of the device.

As mentioned above, the semiconductor device 100.1A-100.3C can be an LDMOSFET. In some embodiments, the LDMOSFET 100.1A-100.3C can be an N-channel LDMOSFT. Alternatively, the LDMOSFET 100.1A-100.3C could be a P-channel LDMOSFET.

The LDMOSFET 100.1A-100.3C can include, within the semiconductor layer 101, a first well region 111 and a second well region 112 positioned laterally adjacent to the first well region 111. In some embodiments, the first well region 111 and the second well region 112 can be physically separated by an additional region of the semiconductor layer, as illustrated. Alternatively, the second well region 112 can abut the first well region 111 (not shown). The first well region 111 and the second well region 112 can be doped regions (also referred to herein as dopant implant regions) within the semiconductor layer 101 and having different type conductivity. The conductivity type of the first and second well regions will vary depending upon whether the LDMOSFET 100.1A-100.3C is an N-channel MOSFET or a P-channel MOSFET. Specifically, in the case of an N-channel MOSFET, the first well region 111 can be doped so as to have N-type conductivity and the second well region 112 can be doped so as to have P-type conductivity; whereas, in the case of a P-channel MOSFET, the first well region 111 can be doped so as to have P-type conductivity and the second well region 112 can be doped so as to have N-type conductivity.

It should be noted that, if the first and second well regions are separated by an additional region 113, the additional region 113 can have the same type conductivity as the second well region 112 but at a lower conductivity level. For example, in the case of an N-channel LDMOSFET, the additional region 113 can be a P-region, which is continuous with the lower portion of the P-semiconductor layer 101. Also, for example, in the case of a P-channel LDMOSFET, the first well region 111 (i.e., a Pwell) and the second well region 112 (i.e., an Nwell) can both be within a deep N-well (not shown) so as to be isolated from the lower portion of the P-semiconductor layer 101 and, thus, the additional region 113 could be an N-region.

The LDMOSFET 100.1A-100.3C can further include a drain region 131 and a source region 132. The drain region 131 and the source region 132 can have the same type conductivity as the first well region 111, but at a higher conductivity level. Thus, for example, in the case of an N-channel LDMOSFET, the drain region 131 and the source region 132 can be N+ drain and source regions; whereas, in the case of a P-channel LDMOSFET, the drain region 131 and the source region 132 can be P+ source and drain regions. The drain region 131 can be immediately adjacent to the first well region 111 distal to the additional region 113 (or distal to a junction between the first and second wells, if applicable). The source region 132 can be immediately adjacent to the second well region 112 distal to the additional region 113 (or distal to a junction between the first and second wells, if applicable).

Various different source/drain configurations for LDMOSFETs are well known in the art and, thus, the detail thereof have been omitted from this specification in order to allow the reader to focus on the salient aspects of the disclosed embodiments. However, it should be understood that the source/drain regions could have any suitable source/drain region configuration. For example, they could be dopant implant regions within the wells, respectively. Alternatively, they could include trenches within the wells, respectively, and filled or over-filled with doped epitaxial monocrystalline semiconductor material (e.g., doped epitaxial monocrystalline Si, SiGe, carbon doped silicon (SiC), etc.). Alternatively, they could be in doped epitaxial monocrystalline semiconductor layers (e.g., doped epitaxial monocrystalline layers of Si, SiGe, SiC, etc.) on the second surface 192 of the semiconductor layer immediately adjacent to the wells, respectively (as illustrated). Optionally, one or both of the source/drain regions could include an extension region (e.g., see source extension region 133) with the same conductivity type, but at a lower conductivity level than the source/drain regions. For example, the source extension region 133 can be a shallow dopant implant region within the second well region 112 and having the same conductivity type at a somewhat lower conductivity level than the source region 132 thereon.

The LDMOSFET 100.1A-100.3C can further include a gate 150 on the second surface 192 of the semiconductor layer 101 between the drain region 131 and the source region 132. Gate 150 can be separated from the drain region 131 by a first distance (d1) and separated from the source region 132 by a second distance (d2) that is less than d1. Gate 150 can have a first gate section and a second gate section.

As discussed in greater detail below, the disclosed embodiments can vary with regard to the configuration of the first gate section (e.g., see first gate section 151.1 of the LDMOSFETs 101.1A-101.1C of FIGS. 1.1A-1.1C, see first gate section 151.2 of the LDMOSFETs 101.2A-101.2C of FIGS. 1.2A-1.2C; see also first gate section 151.3 of the LDMOSFETs 101.3A-101.3C of FIGS. 1.3A-1.3C). In each of the disclosed embodiments, the first gate section 151.1, 151.2 or 151.3 can include a first gate dielectric layer 102 immediately adjacent to the second surface 192 of the semiconductor layer 101 and a first gate conductor layer 103 on the first gate dielectric layer 102. The first gate dielectric layer 102 and first gate conductor layer 103 can, for example, be patterned to form an essentially rectangular-shaped stack with opposing first sidewalls that extend upward from the second surface 192 of the semiconductor layer 101. This stack can be immediately adjacent to a portion of the first well region 111 with one sidewall aligned above the first well region 111 and separated from the drain region 131 by d1. Optionally, this stack can extend laterally onto or completely over the additional region 113, as illustrated. In some embodiments, this stack can be patterned, during processing, in a semiconductor-on-insulator structure. For example, the first gate dielectric layer 102 can be a portion of an insulator layer (e.g., a relatively thick silicon dioxide ($SiO_2$) layer, also referred to herein as a buried oxide (BOX) layer) of a semiconductor-on-insulator structure and the first gate conductor layer 103 can be a doped monocrystalline semiconductor layer (e.g., a P—Si layer) on the insulator layer. In any case, the first gate dielectric layer 102 can be relatively thick. Specifically, the first gate dielectric layer 102 can have a first thickness (t1). In some embodiments t1 can be at least 15 nm (e.g., >20 nm).

Referring specifically to FIGS. 1.2A-1.3C, in some embodiments the first gate section can further include an additional gate conductor layer on the first gate conductor layer. For example, as illustrated in FIGS. 1.2A-1.2C, the first gate section 151.2 of the LDMOSFET 100.2A-100.2C can include an additional gate conductor layer 129. This additional gate conductor layer 129 can be a doped epitaxial monocrystalline semiconductor layer. As discussed in greater detail below with regard to the method embodiments, this layer 129 can, for example, be grown concurrently with epitaxial source/drain regions such that it has the same conductivity type, conductivity level, and semiconductor material as the epitaxial source/drain regions.

Alternatively, as illustrated in FIGS. 1.3A-1.3C, the first gate section 151.3 of the LDMOSFET 100.3A-100.3C can include an additional gate conductor layer 129'. This additional gate conductor layer 129' can also be a doped epitaxial monocrystalline semiconductor layer. However, as discussed in greater detail below with regard to the method embodiments, this layer 129' can, for example, be grown during a discrete process such that it can be different from any epitaxial source/drain regions also grown during processing (e.g., different conductivity type, different conductivity level, different semiconductor material, etc.).

Referring again to FIGS. 1.1A-1.3C, in each of the embodiments an isolation structure 114 can optionally be positioned laterally immediately adjacent to the sidewall on the drain-side of the first gate section 151.1-151.3 such that it is in contact with vertical surfaces of the first gate dielectric layer 102 and the first gate conductor layer 103. This isolation structure 114 can also extend vertically into, but not completely through, the first well region 111, as illustrated. The isolation structure 114 can be formed, during processing, as a trench isolation structure and can include one or more layers of isolation materials (e.g., $SiO_2$, silicon nitride (SiN), silicon oxynitride (SiON), etc.). A sidewall spacer 127 can be on the second surface 192 of the semiconductor layer 101 positioned laterally adjacent to an upper sidewall of the isolation structure 114 opposite the first gate section 151.1-151.3. Thus, the sidewall spacer 127 can be positioned laterally between the isolation structure 114 and the drain region 131. The sidewall spacer 127 can include one or more layers of dielectric spacer material (e.g., $SiO_2$, SiN, SiON, etc.). It should be noted that in embodiments without the isolation structure 114, the sidewall spacer 127 can be positioned laterally adjacent to the sidewall on the drain-side of the first gate section 151.1-151.3 such that it is in contact with vertical surfaces of the first gate dielectric layer 102 and the first gate conductor layer 103. In this case, a thin dielectric layer and, particularly, a thin silicide block layer (e.g., a SiN layer) can extend along the second surface 192 some distance between the sidewall spacer 127 and the drain region 131.

The second gate section 152 can include a second gate dielectric layer 121, which on the semiconductor layer 101 above the second well region 112 and which further extending up a source-side sidewall of the first gate section 151.1-151.3 onto a top surface of the first gate conductor layer 103, and a second gate conductor layer 122 on the second gate dielectric layer 121. The second gate dielectric layer 121 can be relatively thin. Specifically, the second gate dielectric layer 121 can have a second thickness (t2) that is less than t1. For example, t1 can be less than 10 nm. In some embodiments, the second gate section 152 can have a gate first high-K metal gate configuration. For example, the second gate dielectric layer can include one or more conformal layers of gate dielectric material including, but not limited to, an interfacial layer (e.g., an SiO2 layer and/or an SiON layer or some other layer or combination of layers) with a thickness of, for example, 0.5-2 nm and a high-K gate dielectric layer with a thickness of, for example, 2-5 nm on the interfacial layer. The second gate conductor layer 122 could include one or more layers of gate conductor material including, but not limited to, a metallic gate conductor layer (e.g., a metal or metal alloy gate conductor layer) on the second gate dielectric layer and an optional doped polycrystalline semiconductor layer (e.g., a doped polysilicon semiconductor layer) on the metallic gate conductor layer. In other embodiments, the second gate section 152 can have a gate first polysilicon gate configuration. For example, the second gate dielectric layer 121 could be a conformal $SiO_2$ layer and the second gate conductor layer 122 could be a doped polysilicon gate conductor layer. In still other embodiments, the second gate section 152 can have any other suitable gate configuration where the second gate dielectric layer 121 is relatively thin as compared to the first gate dielectric layer 102 in the first gate section. In any case, the second gate section 152 can have second sidewalls including one extending upward from the second surface 192 of the semiconductor layer 101 above the second well region 112 and another extending upward from the top surface of the first gate conductor layer 103. Gate sidewall spacers 125 can be positioned laterally adjacent to the second sidewalls. For example, one gate sidewall spacer 125 can be on the second surface 192 of the semiconductor layer 101 and can isolate the source region 132 from gate 150. Another gate sidewall spacer 125 can be on the top surface of the first gate conductor layer 103 (e.g., positioned laterally immediately adjacent to essentially vertically aligned surfaces of the second gate dielectric layer 121 and the second gate conductor layer 122). Referring to FIGS. 1.2A-1.3C, in embodiments where the first gate section includes an additional gate conductor layer 129, 129', this gate sidewall spacer 125 can be positioned laterally between the second sidewall and the additional gate conductor layer 129, 129'. In any case, gate sidewall spacers 125 can include one or more layers of dielectric spacer material (e.g., $SiO_2$, SiN, SiON, etc.).

Referring again to FIGS. 1.1A-1.3C, in each of the embodiments metal silicide layers 180 can be on the drain region 131 and the source region 132. Optionally, a metal silicide layer 180 can also be on the first gate section (e.g., immediately adjacent to the first gate conductor layer 102 in first gate section 151.1, as shown in FIGS. 1.1A-1.1C or immediately adjacent to the additional gate conductor layer 129, 129' of the first gate section 151.2, 151.3, as shown in FIGS. 1.2A-1.3C). Optionally, a metal silicide layer 180 can also be on the second gate section 152 immediately adjacent to an uppermost polysilicon layer (if present). In any case, the metal silicide layers can be, for example, layers of cobalt silicide (CoSi), nickel silicide (NiSi), tungsten silicide (WSi), titanium silicide (TiSi), or any other suitable metal silicide material.

One or more layers of interlayer dielectric (ILD) material 160 can cover the LDMOSFET 100.1A-100.1C and middle of the line (MOL) contacts can extend through the ILD material 160 to various components of the LDMOSFET. For example, in each of the embodiments MOL contacts can include drain contact(s) 161 that extend through the ILD material 160 to the drain region 131 and source contact(s) 162 that extend through the ILD material 160 to the source region 132. The MOL contacts can also include one or more gate contacts, as discussed in greater detail below.

In some embodiments (e.g., see 100.1A of FIG. 1.1A, 100.2A of FIG. 1.2A, and 100.3A of FIG. 1.3A), a shared gate contact 170 can extend through the ILD material 160 to the two sections of the gate 150 (i.e., to the applicable first gate section 151.1, 151.2, or 151.3 and to the second gate section 152 adjacent thereto) to enable gate biasing with the same gate bias voltage (VG) from the same gate bias voltage source 175.

In other embodiments (e.g., see 100.1B of FIG. 1.1B, 100.2B of FIG. 1.2B, and 100.3B of FIG. 1.3B), discrete gate contacts, including a first gate contact 171 and a second gate contact 172, can extend through the ILD material 160 to the applicable first gate section 151.1, 151.2 or 151.3 and the second gate section 152, respectively, of the gate 150. The discrete gate contacts 171-172 can be electrically connected, e.g., by back end of the line (BEOL) interconnect(s), to enable gate biasing with the same gate bias voltage (VG) from the same gate bias voltage source 175. In still other embodiments (e.g., see 100.1C of FIG. 1.1C, 100.2C of FIG. 1.2C, and 100.3C of FIG. 1.3C), discrete gate contacts, including a first gate contact 171 and a second gate contact 172, can extend through the ILD material 160 to the applicable first gate section 151.1, 151.2, or 151.3 and the second gate section 152, respectively, of the gate 150. These discrete gate contacts 171-172 can be electrically isolated from each other to enable gate biasing with different gate bias voltages (VG1 and VG2) from different gate bias voltage sources 176 and 177, respectively.

It should be noted that the gate contact configurations and corresponding gate biasing conditions described above and illustrated in FIGS. 1.1A-1.3C are provided for illustration purposes and are not intended to be limiting. Alternatively, any other suitable gate contact configurations and corresponding gate biasing conditions could be employed. For example, in other embodiments, one of the two gate sections could be contacted and biased with a gate bias voltage, while the other of the two gate sections is left floating. For example, the first gate section could be contacted and biased with a gate bias voltage, while the second gate section remains floating. Alternatively, the second gate section could be contacted and biased with a gate bias voltage, while the first gate section remains floating.

With the above-described configuration, the LDMOSFET 100.1A-100.3C includes a channel region 140 in the semiconductor aligned below gate 150. This channel region 140 further includes two series-connected channel sections and, particularly, a first channel section 141 aligned below the first gate section 151.1 (or 151.2 or 151.3, depending upon the embodiment) and a second channel section 142 aligned below the second gate section 152 such that it is positioned laterally adjacent to and continuous with the first channel section 141. Additionally, the LDMOSFET 100.1A-100.3C can include a drain drift region 135 and, particularly, a current path in the first well region 111 between the first channel section 141 and the drain region 131 (e.g., extending down and around the isolation structure 114, if present.

Also disclosed herein are method embodiments for forming the various semiconductor device embodiments described above and illustrated in FIGS. 1.1A-1.3C.

The method can include providing a semiconductor layer and, particularly, semiconductor-on-insulator structure (see FIG. 2). This semiconductor-on-insulator structure can include, for example, a semiconductor layer 101 having a first surface 191 (i.e., a bottom surface) and a second surface 192 (i.e., a top surface) opposite the first surface 191, an insulator layer 102 on the second surface 192, and another semiconductor layer 103 on the insulator layer 102 (see FIG. 2). This semiconductor layer 101 can be a monocrystalline semiconductor substrate (e.g., a Si substrate). The insulator layer 102 can be an $SiO_2$ layer. The other semiconductor layer 103 can be a monocrystalline semiconductor layer (e.g., a Si layer). The semiconductor layers 101 and 103 can, for example, be doped with a P-type dopant so as to have P-type conductivity at a relatively low conductivity level (e.g., so as to be a P-semiconductor layer).

Figure 3:
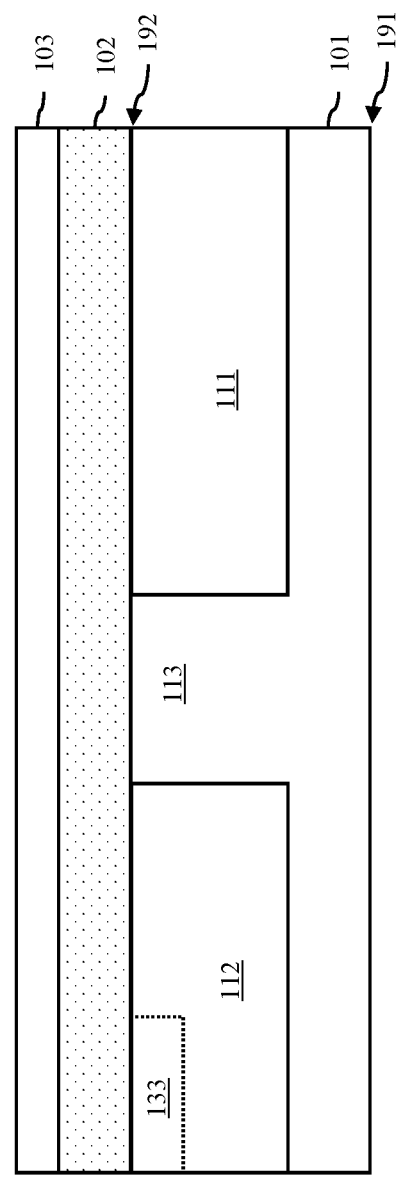

The method can further include forming, within the semiconductor layer 101, a first well region 111 and a second well region 112 positioned laterally adjacent to the first well region 111 (e.g., see FIG. 3). The well regions can, for example, be formed by performing discrete dopant implantation processes. That is, a first mask could be formed on the second surface 192 of the semiconductor layer 101 and lithographically patterned and etched so as to have an opening that exposes a first area of the semiconductor layer. A dopant can be implanted through the opening to form the first well region with a desired conductivity type at a desired conductivity level. The first mask can then be removed. Similarly, a second mask could be formed on the second surface 192 of the semiconductor layer 101 and lithographically patterned and etched so as to have an opening that exposes a second area of the semiconductor layer. A different dopant can be implanted through the opening to form the second well region with a desired conductivity type (which is different from that of the first well region) at a desired conductivity level. The second mask can then be removed. Such dopant implantation processes are well known in the art and, thus, the details thereof have been omitted from this specification in order to allow the reader to focus on the salient aspects of the disclosed embodiments. In any case, these two masked dopant implantation processes can be performed so that either the first well region 111 and the second well region 112 are physically separated by an additional region 113, as illustrated, or so that the second well region 112 abuts the first well region 111. It should be noted that the conductivity type of the first and second well regions will vary depending upon whether the LDMOSFET 110.1A-110.3C is an N-channel MOSFET or a P-channel MOSFET. Specifically, in the case of an N-channel MOSFET, doping should be performed so that the first well region 111 has N-type conductivity and the second well region 112 has P-type conductivity; whereas, in the case of a P-channel MOSFET, doping should be performed so that the first well region 111 has P-type conductivity and the second well region 112 has N-type conductivity. Optionally, in the case of a P-channel LDMOSFET, prior to formation of the first and second well regions, a deep Nwell could be formed (not shown, using a similar masked dopant implantation process) and the first well region 111 (i.e., a Pwell) and the second well region 112 (i.e., an Nwell) could both be formed within the deep Nwell. Optionally, one or more shallow dopant implant regions can also be formed within one or both wells in the semiconductor layer 101 (e.g., see source extension region 133) using similar masked dopant implantation techniques.

Figure 4:
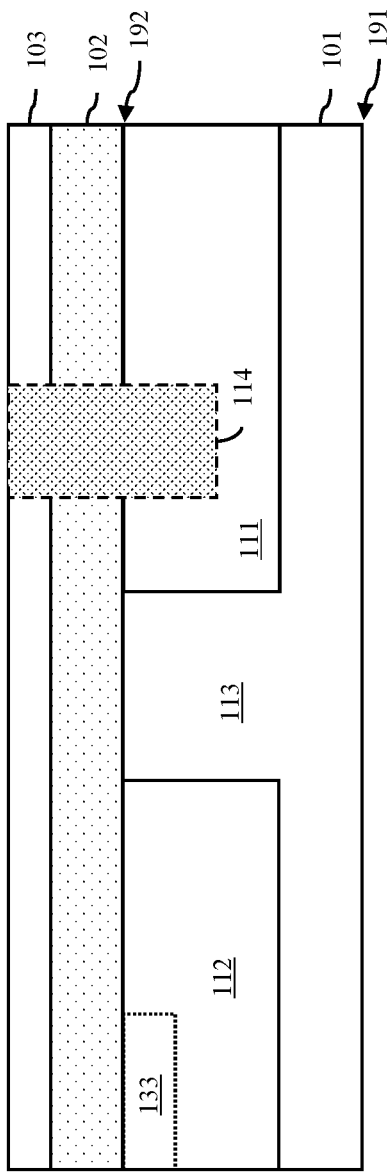

The method can further include, optionally, forming an isolation structure 114 extending through layers 103 and 102 into the first well region 111 in the semiconductor layer 101 below (see FIG. 4). This isolation structure 114 can be formed, for example, using conventional trench isolation formation techniques. That is, a trench can be formed (e.g., lithographically patterned and etched) through the layers 103, 102 and into the first well region 111 without extending completely through the first well region 111 (i.e., so the bottom of the trench is above the level of the bottom of the first well region 111). Placement of the trench can be such that it will run essentially parallel to and between a subsequently formed gate and a subsequently formed drain region. Following trench formation, one or more layers of isolation material (e.g., $SiO_2$, SiN, SiON, etc.) can be deposited so as to fill the trench. Then, a chemical mechanical polishing (CMP) process can be performed in order to remove any isolation material from the second surface 192.

Figure 5:
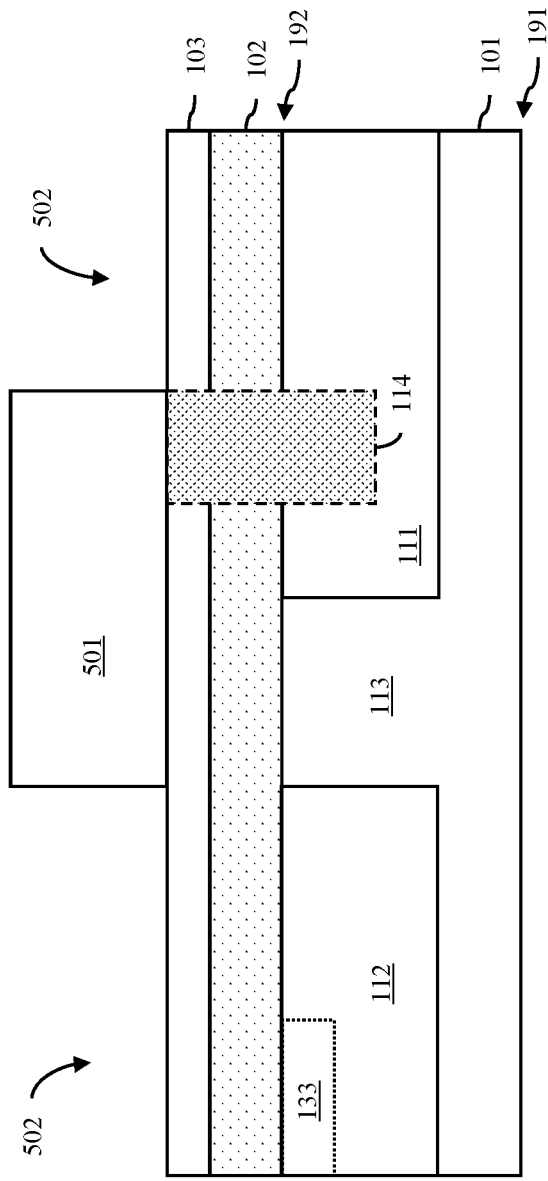
Figure 6:
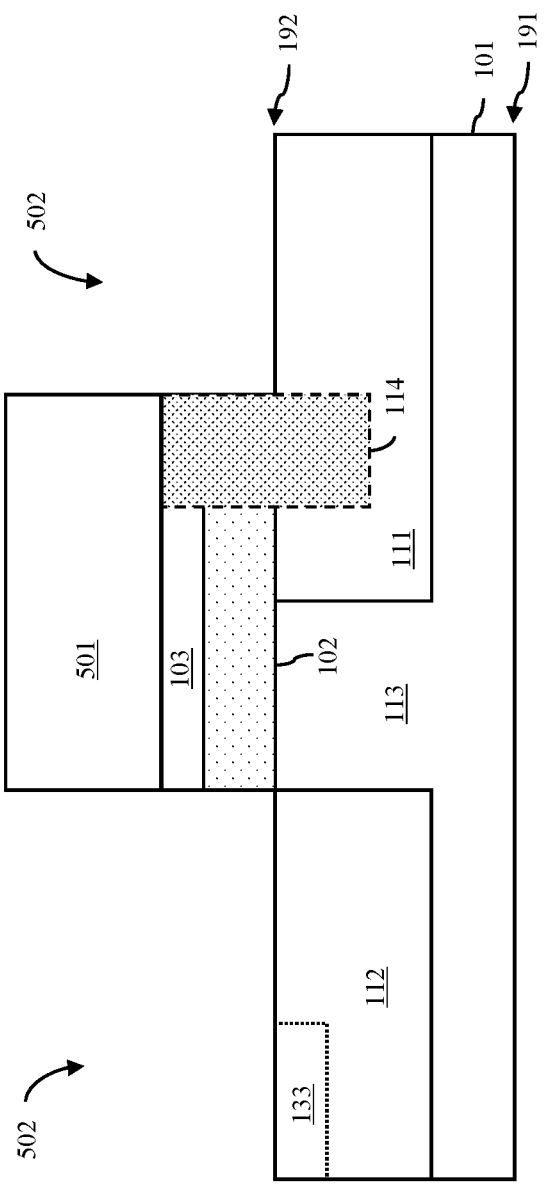

The method can further include forming a first gate section (see FIGS. 5-6). For example, a mask layer 501 (e.g., a SiN hard mask layer or some other suitable mask layer) can be formed on the semiconductor layer 103. The mask layer 501 can be patterned (e.g., using conventional lithographic patterning and etch techniques) so that it includes openings 502, which expose portions of the semiconductor layer 103 above the first well region 111 (e.g., on one side of the isolation structure 114 and above the second well region 112 (see FIG. 5). One or more selective anisotropic etch processes can be performed in order to remove the exposed portions of the semiconductor layer 103 and the insulator layer 102 below (see FIG. 6). Then, the mask layer 501 can be selectively removed. As a result, the first gate section includes the remaining portion of the insulator layer 102 as a first gate dielectric layer and the remaining portion of the semiconductor layer 103 above as a first gate conductor layer. Additionally, the first gate section has opposing first sidewalls, one covered by the isolation structure 114 (if present) and the opposite one exposed.

Figure 7:
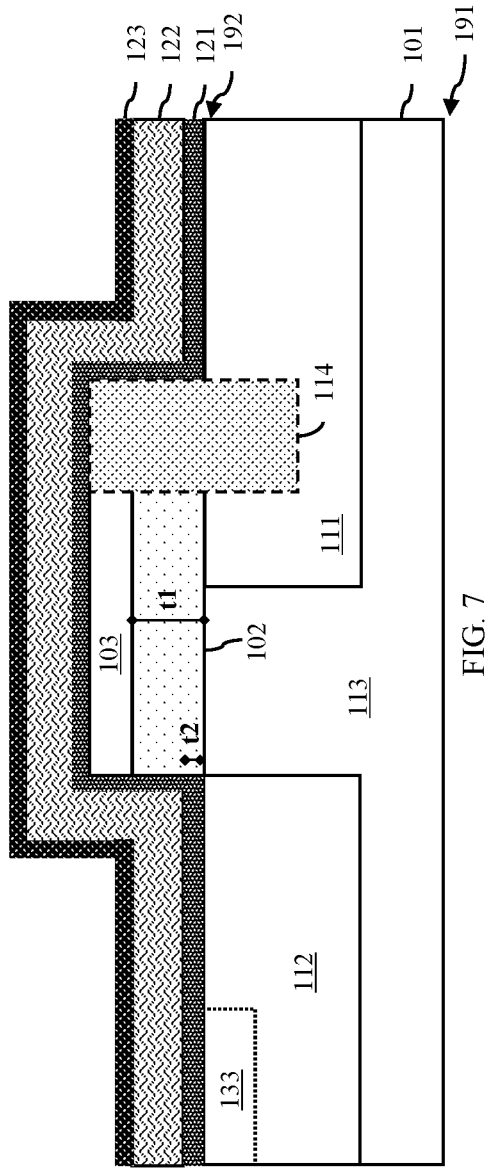
Figure 8:
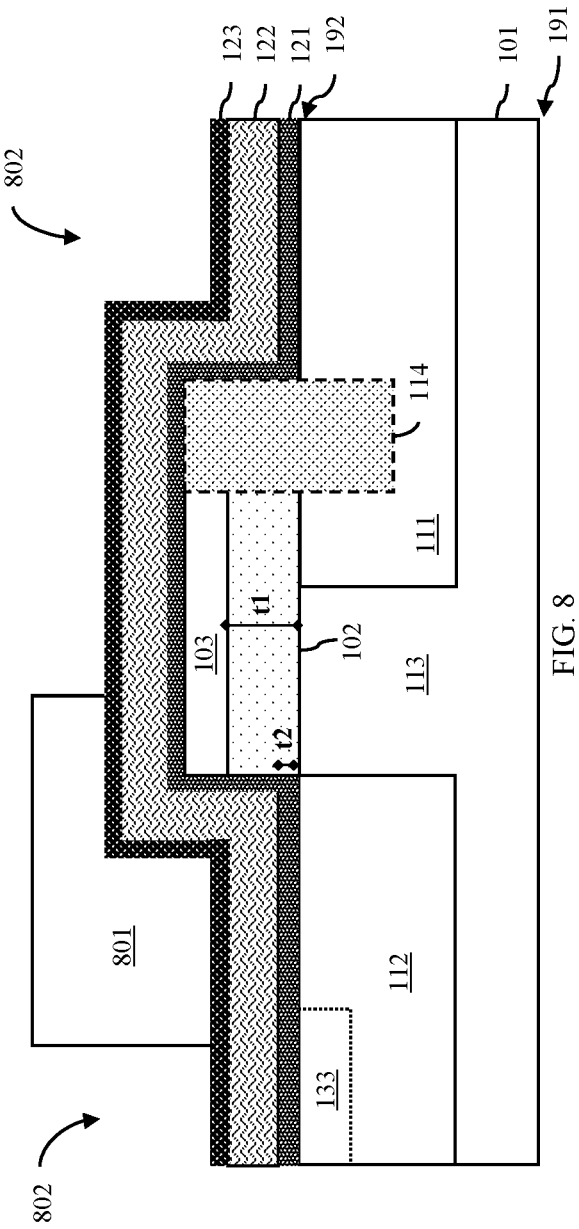
Figure 12:
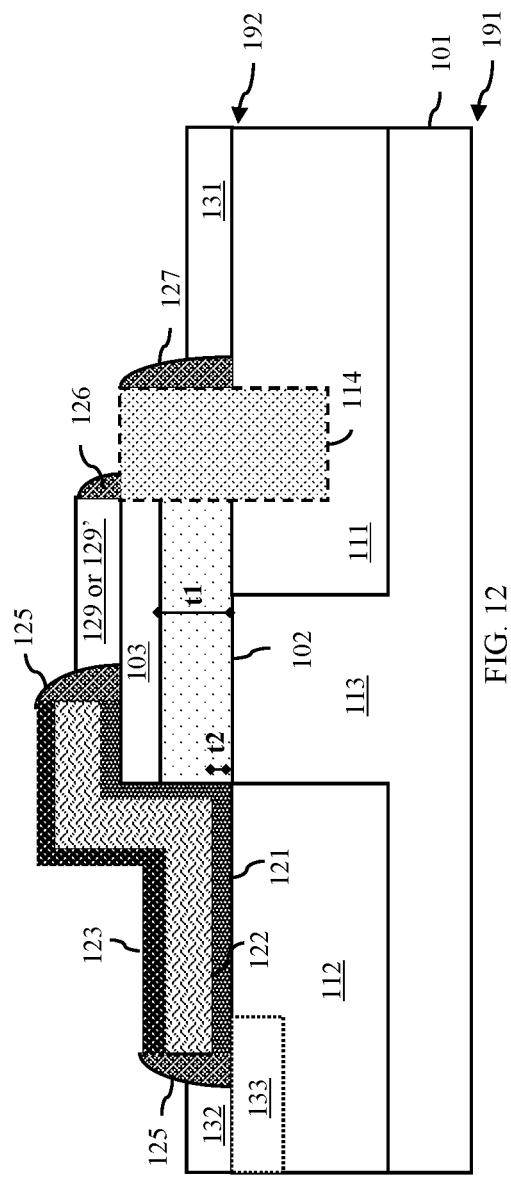
FIG. 12 is a cross-section illustration of a partially completed semiconductor structure formed according to method embodiment for forming any of the structures shown in FIGS. 1.2A-1.3C.

The method can further include forming a second gate section (see FIGS. 7-9). For example, multiple gate layers can be deposited over the partially completed structure (see FIG. 7). These layers can include a second gate dielectric layer 121, a second gate conductor layer 122 on the second gate dielectric layer 121, and a dielectric gate cap layer 123 (e.g., a SiN gate cap layer) on the second gate conductor layer 122. A mask layer 801 can be formed on the dielectric gate cap layer 123 and patterned (e.g., using conventional lithographic patterning and etch techniques) to form openings 802 that expose portions of the dielectric gate cap layer 123, including one portion above one side of the first gate section and further extending over a distal section of the first well region 111 and another portion above a distal section of the second well region 112 (see FIG. 8). One or more selective anisotropic etch processes can be performed to remove exposed portions of the dielectric gate cap layer 123 and portions of the second gate conductor and gate dielectric layers below (see FIG. 9). The resulting second gate stack has second sidewalls, one extending essentially vertically from the second surface 192 of the semiconductor layer 101 at the second well region and the other extending essentially vertically from the top surface of the first gate conductor layer 103. Gate sidewall spacers 125 can be formed on the second sidewalls, e.g., using conventional gate sidewall spacer formation techniques including conformal deposition of one or more dielectric spacer material layers and an anisotropic etch process so that dielectric spacer material remains on essentially vertical surfaces as sidewall spacers (see FIG. 10). This same process can concurrently result in the formation of a sidewall spacer 127 on the semiconductor layer 101 above the first well region 111 and positioned laterally adjacent to the isolation structure 114 (if present) or a first sidewall of the first gate section (if an isolation structure 114 was not previously formed).

Following gate formation, a drain region 131 and a source region 132 for the LDMOSFET 100.1A-100.3C could be formed immediately adjacent to the first well region 111 and the second well region 112, respectively (see FIGS. 11.1-11.3b). Various different source/drain formation techniques for LDMOSFETs are well known in the art. For example, the source/drain regions can be formed by performing a dopant implantation process to dope portions of the first well region and the second well region exposed at the second surface 192 of the semiconductor layer 101. Alternatively, the source/drain regions can be formed by forming trenches in portions of the first well region and the second well region exposed at the second surface 192 of the semiconductor layer 101 and either filling or over-filling the trenches doped epitaxial semiconductor material. Alternatively, the source/drain regions can be formed by epitaxially growing in situ doped semiconductor material on portions of the first well region 111 and the second well region 112 exposed at the second surface 192 of the semiconductor layer 101. Such techniques are well known in the art and, thus, have been omitted from the specification in order to allow the reader to focus on the salient aspects of the disclosed embodiments. However, it should be noted that, during source/drain formation, processing can also be performed to prevent formation any additional semiconductor material on the first gate conductor layer of the first gate section or to facilitate formation of additional semiconductor material on the first gate section.

For example, as illustrated in FIG. 11.1, during formation of the LDMOSFET 100.1A-100.1C of FIGS. 1.1A-1.1C, a mask layer 1101 can be formed over the partially completed structure. The mask layer 1101 can further be patterned (e.g., using conventional lithographic patterning and etch techniques) so that a remaining portion of the mask layer 1101 protects the first gate section and so that openings 1102 expose the surfaces of the semiconductor layer 101 for source/drain formation. Then, the mask layer 1101 can be selectively removed. Alternatively, as illustrated in FIG. 11.2, during formation of the LDMOSFET 100.2A-100.2C of FIGS. 1.2A-1.2C, during growth of epitaxial source/drain regions, an additional gate conductor layer 129 and, particularly, an in situ doped epitaxial monocrystalline semiconductor layer can also be grown on the exposed surface of the first gate conductor layer 103 positioned laterally adjacent to the gate sidewall spacer 125. In this case, the additional gate conductor layer 129 will have the same type conductivity, the same conductivity level, and the same semiconductor material as the source/drain regions. Alternatively, as illustrated in FIGS. 11.3a-11.3b, during formation of the LDMOSFET 100.3A-100.3C of FIGS. 1.3A-1.3C, a mask layer 1101 can be formed over the partially completed structure. The mask layer 1101 can further be patterned (e.g., using conventional lithographic patterning and etch techniques) so that a remaining portion of the mask layer 1101 protects the first gate section and so that openings 1102 expose the surfaces of the semiconductor layer 101 for source/drain formation. Source/drain regions 131-132 can be formed (e.g., by in situ doped epitaxial deposition) on the exposed semiconductor surfaces. The mask layer 1101 can then be selectively removed. In this case, however, after formation of the source/drain regions, another mask layer 1103 can be formed over the partially completed structure. The mask layer 1103 can be patterned (e.g., using conventional lithographic patterning and etch techniques) with an opening 1104 that exposes the top surface of the first gate conductor layer 103. An additional gate conductor layer 129' and, particularly, an in situ doped epitaxial monocrystalline semiconductor layer can then be grown on the exposed top surface of the first gate conductor layer 103 positioned laterally adjacent to the gate sidewall spacer 125. In this case, the semiconductor material of the additional gate conductor layer 129' can be different, in some way, from the semiconductor material of the source/drain regions. That is, it can have a different type conductivity, different conductivity level, and/or different semiconductor material. It should be noted that the dielectric gate cap layer 123 will protect the second gate conductor layer 122 during these above-described epitaxial semiconductor growth processes. The mask layer 1103 can then be selectively removed.

In embodiments that include the formation of an additional gate conductor layer 129 or 129', optionally an additional gate sidewall spacer 126 can be formed on the top surface of the isolation structure 114 positioned laterally adjacent to the additional gate conductor layer 129 or 129' (e.g., using conventional gate sidewall spacer formation techniques as discussed above).

Additional processing can include, but is not limited to, selective removal of the dielectric gate cap, metal silicide 180 formation on exposed silicon or polysilicon surfaces, formation of one or more layers of ILD material over the device, formation of MOL contacts extending through the ILD material to device components, formation of BEOL interconnects, etc. These features are discussed in detail above with regard to structure embodiments and techniques for formation of these features are well known in the art. Thus, the details thereof have been omitted from this specification in order to allow the reader to focus on the salient aspects of the disclosed embodiments.

It should be noted that, for purposes of illustration, FIGS. 1.1A-1.3C show gate contact(s) being aligned horizontally between a drain contact 161 and a source contact 162. However, it should be understood that the figures are not intended to be limiting. Alternatively, contact placement in any of the disclosed embodiments could be modified as compared to what is shown in FIGS. 1.1A-1.3C. For example, typically, any gate contacts would be offset from the drain and source contacts (e.g., to reduce parasitic capacitance, to allow for usage of an unsilicided gate area, etc.).

Figure 14A:
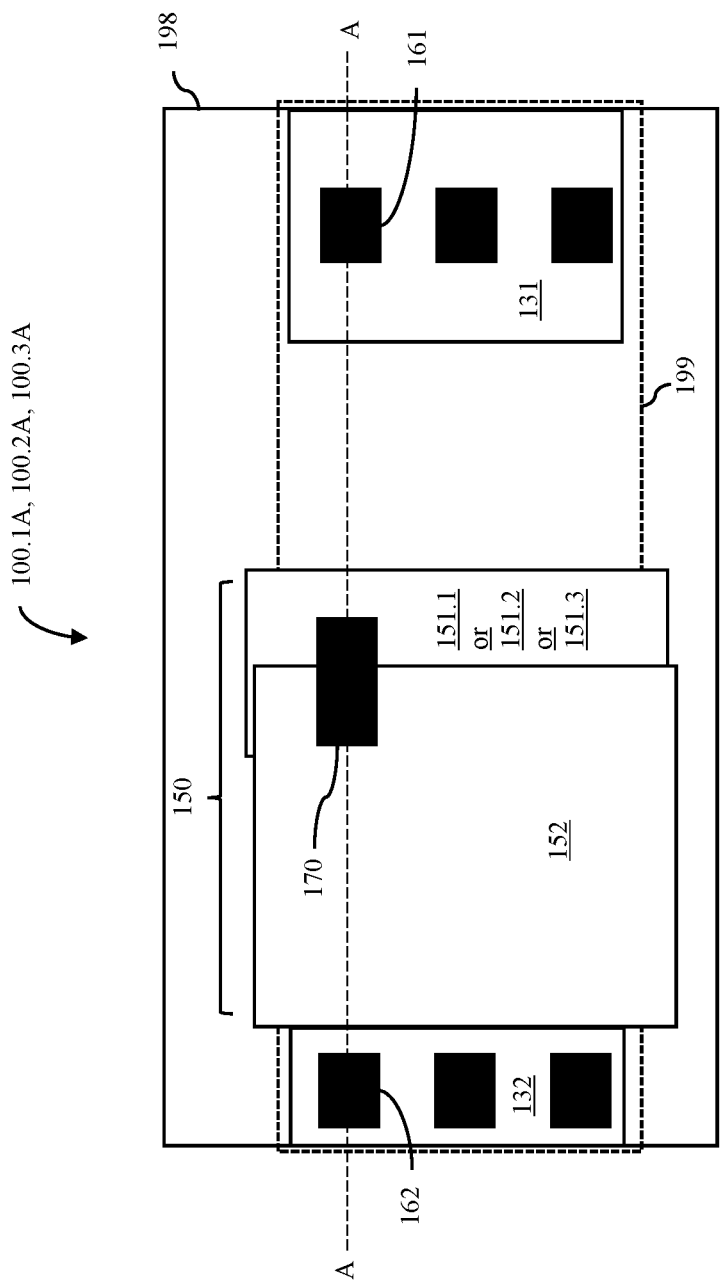
FIGS. 14A-14B are layout diagrams illustrating gate contact placement above the active device region in some embodiments of the semiconductor device.
Figure 14B:
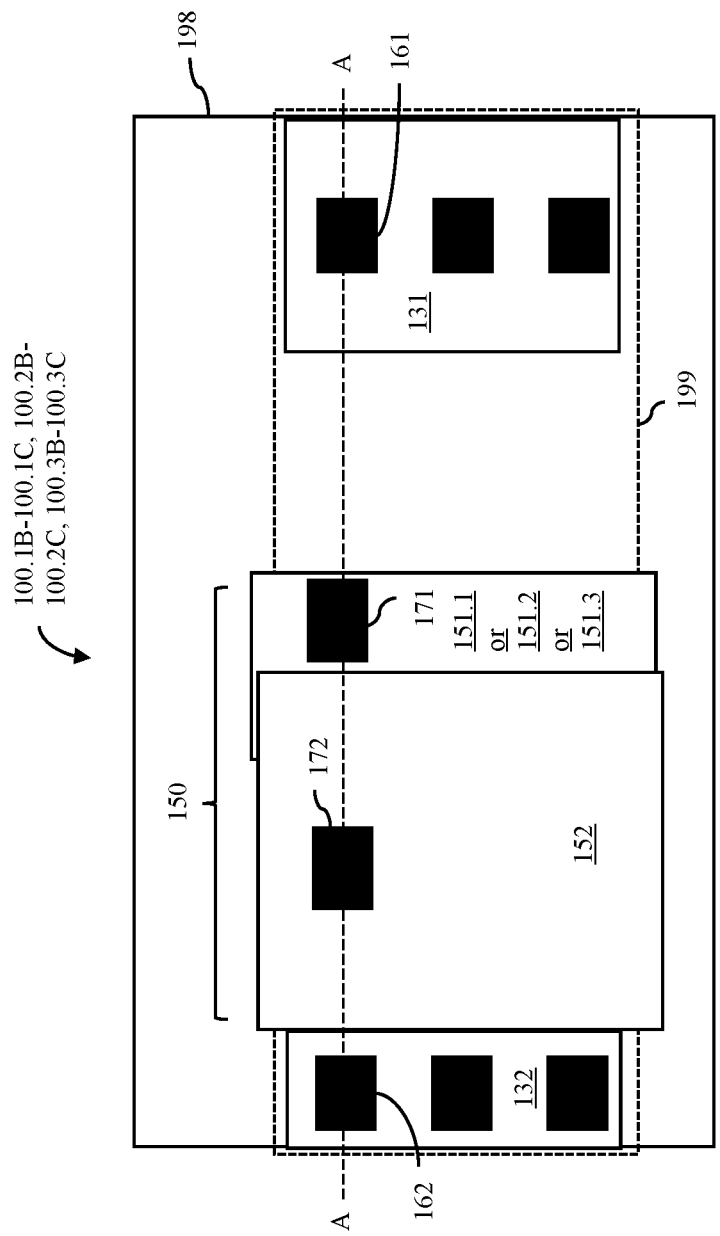

More specifically, FIG. 14A is a layout diagram showing contact placement for some embodiments of the structure, as shown in FIGS. 1.1A, 1.2A and 1.3A, and FIG. 14B is a layout diagram showing contact placement for other embodiments of the structure, as shown in FIGS. 1.1B-1.1C, 1.2B-1.2C, and 1.3B-1.3C. FIGS. 14A and 14B illustrate shared gate contact 170 and discrete gate contacts 171-172 placed in the same vertical plane AA as a drain contact 161 and a source contact 162 so as to be aligned vertically above the active device region 199 (which is, for example, laterally surrounded by trench isolation structures 198).

Figure 15A:
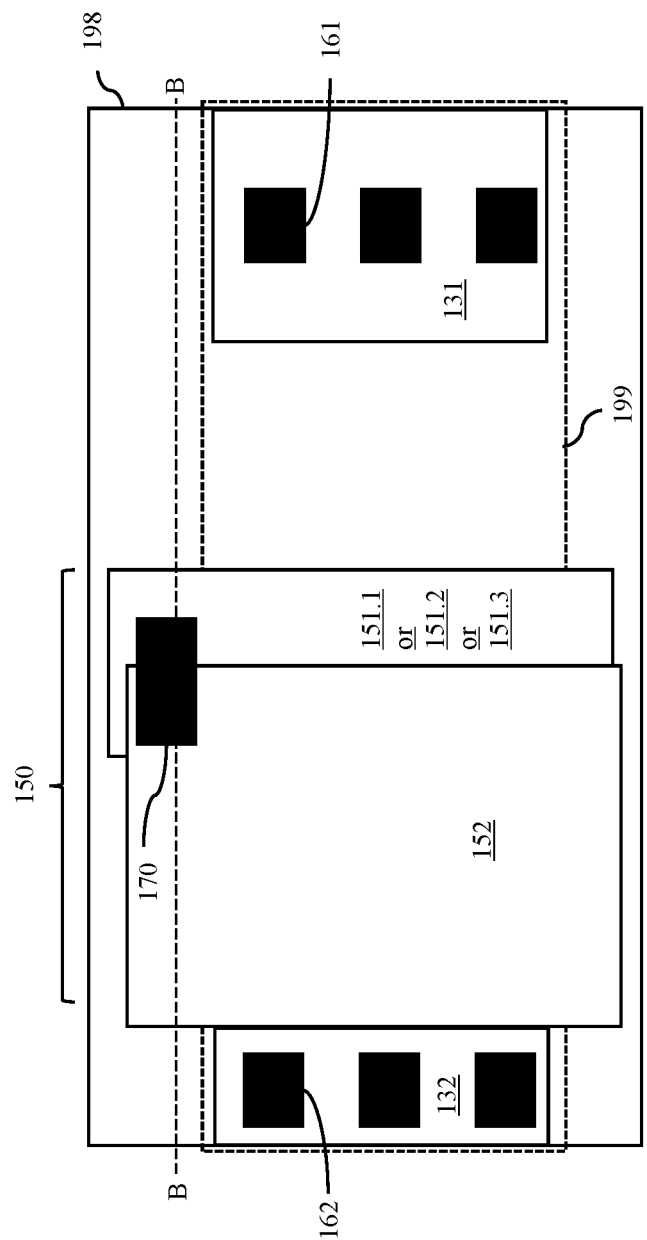
FIGS. 15A-15B are layout diagrams illustrating gate contact placement offset from the active device region in other embodiments of the semiconductor device.
Figure 15B:
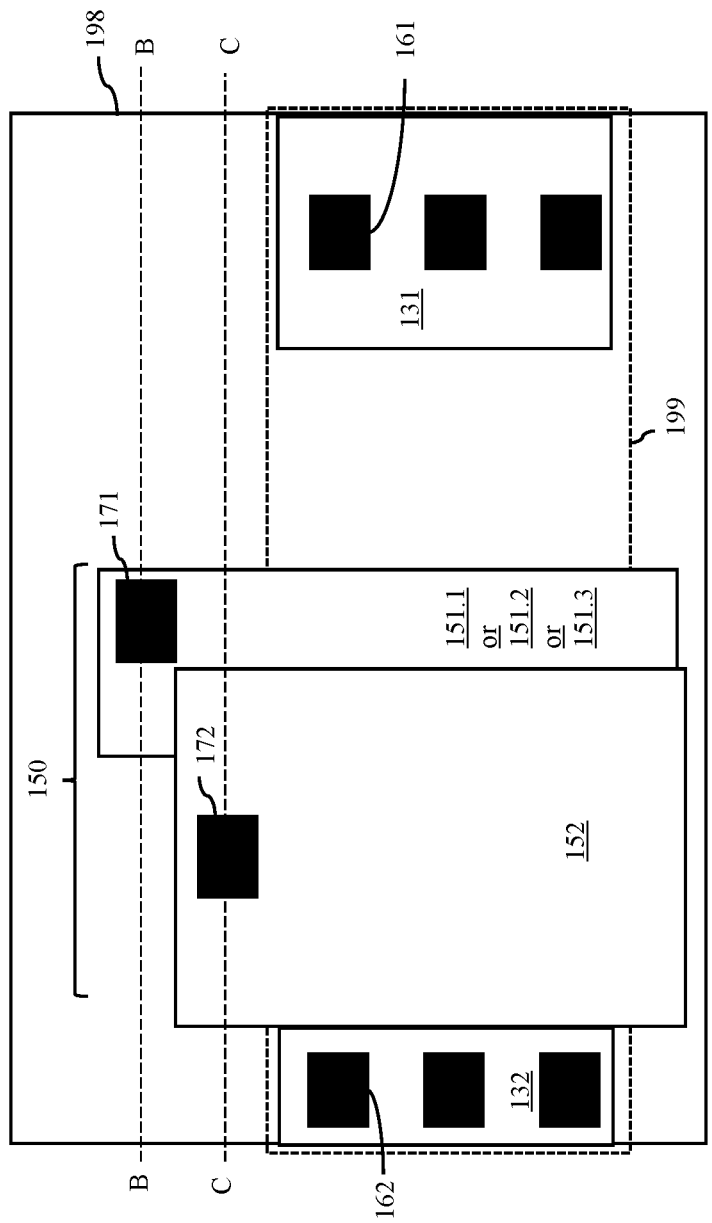

FIG. 15A is a layout diagram showing alternative contact placement for some embodiments of the structure, e.g., similar to the structures shown in FIGS. 1.1A, 1.2A and 1.3A. FIG. 15B is a layout diagram showing alternative contact placement for other embodiments of the structure, e.g., similar to the structures shown in FIGS. 1.1B-1.1C, 1.2B-1.2C, and 1.3B-1.3C. As illustrated in FIG. 15A, the shared gate contact 170 could be in a vertical plane BB offset laterally from all drain contact(s) 161 and source contact(s) 162 and, optionally, external to the active device region 199 (e.g., aligned vertically above a neighboring trench isolation structure 198). As illustrated in FIG. 15B, the discrete gate contacts 171 and 172 can be in vertical planes BB and CC, respectively, offset laterally from all the drain contact(s) 161 and source contact(s) 162 and, optionally, external to the active device region 199 (i.e., aligned vertically above a neighboring trench isolation structure 198). Additionally, the discrete gate contacts 171 and 172 could be in different vertical planes, offset laterally from each other (as illustrated) or, alternatively, in the same vertical plane so as to be aligned horizontally.

It should be noted that in the structures and methods described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Additionally, it should be noted that in the structures and methods described above the second gate section 152 of the gate 150 can be formed as a gate-first polysilicon gate stack, which includes, for example: a silicon dioxide gate dielectric layer; a doped polysilicon gate conductor layer on the silicon dioxide gate dielectric layer; and, optionally, a metal silicide layer (e.g., CoSi, NiSi, WSi, TiSi, or any other suitable metal silicide material layer) on the doped polysilicon gate conductor layer. Alternatively, the second gate section 152 could be formed as a gate-first high-K metal gate (HKMG) stack, which includes, for example: an interfacial layer (e.g., an SiO2 layer and/or an SiON layer) on the semiconductor layer; a high-K gate dielectric layer (i.e., a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide) on the interfacial layer; one or more stacked metal layers (e.g., a metal capping layer and an additional metal material layer suitable for dipole formation on the metal capping layer) on the high-K gate dielectric layer; an optional doped polysilicon gate conductor layer on the metal gate conductor layer(s); and an optional metal silicide layer, as discussed above, on the doped polysilicon gate conductor layer. Alternatively, the gate stack be any other suitable type of gate stack (e.g., a replacement metal gate (RMG) structure), which includes, for example: a high-K gate dielectric layer; a work function metal layer on the high-K gate dielectric layer; an optional doped polysilicon gate conductor layer on the work function metal layer; and an optional metal silicide layer, as discussed above, on the doped polysilicon gate conductor layer.

Various different gate-first and replacement metal gate structures are known in the art and, thus, the details of such gate structures have been omitted from this specification in order to allow the reader to focus on the salient aspects of the disclosed embodiments. However, as discussed above, those skilled in the art will recognize that the configuration of the gate stack of the gate structure can vary depending upon whether the FET is an NFET or a PFET. For example, the optimal effective work function for the gate structure of an NFET is between about 3.9 eV and about 4.2 eV, whereas the optimal effective work function for the gate structure of a PFET is between about 4.9 eV and about 5.2 eV. In a gate-first polysilicon gate stack, the desired effective work function can be achieved, for example, by doping the polysilicon gate conductor layer with different dopants. For example, in an NFET, the polysilicon gate conductor layer can be doped with an N-type dopant (e.g., phosphorous (P), arsenic (As) or antimony (Sb)). In a PFET, the polysilicon gate conductor layer can be doped with P-type dopant (e.g., boron (B)). In a gate-first HKMG, the desired effective work function can be achieved, for example, using different metal layers on the high-K gate dielectric layer. For example, in an NFET, the metal layers on the high-K gate dielectric layer can include a titanium nitride (TiN) capping layer and, on the TiN capping layer, a lanthanum (La) layer for optimal NFET-specific dipole formation. In a PFET, the metal layers on the high-K gate dielectric layer can include a TiN capping layer and, on the TiN capping layer, an aluminum (Al) layer for optimal PFET-specific dipole formation. In an RMG, the desired effective work function can be achieved, for example, using different work function metal layers immediately adjacent to the high-K gate dielectric layer. Metals (and metal alloys), which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Metals (and metal alloys), which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Such gate structures and the techniques for forming them are well known in the art and, thus, the details thereof have been omitted from this specification in order to allow the reader to focus on the salient aspects of the disclosed embodiments.

Additionally, the method embodiments described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, in the structure and method embodiments described above, the terminology used is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
    a semiconductor layer;
    a gate including:
        a first gate section including: a first gate dielectric layer on the semiconductor layer; and a first gate conductor layer on the first gate dielectric layer; and
        a second gate section including: a second gate dielectric layer on the semiconductor layer and further extending onto the first gate conductor layer; and a second gate conductor layer on the second gate dielectric layer, wherein the second gate dielectric layer is thinner than the first gate dielectric layer;
    a gate sidewall spacer on the first gate conductor layer of the first gate section and positioned laterally adjacent to the second gate dielectric layer and the second gate conductor layer of the second gate section; and
    an isolation structure positioned laterally immediately adjacent to the first gate dielectric layer and the first gate conductor layer of the first gate section opposite a lower portion of the second gate section, wherein the isolation structure extends into the semiconductor layer.

2. The device of claim 1, further comprising:
    a first well region within the semiconductor layer; and
    a second well region within the semiconductor layer positioned laterally adjacent to the first well region and having a different type conductivity than the first well region, wherein the first gate section is adjacent to the first well region and the second gate section is adjacent to the second well region.

3. The device of claim 2,
    wherein the first well region and the second well region are separated by an additional region of the semiconductor layer having a same type conductivity as the second well region at a lower conductivity level, and
    wherein at least the first gate section is adjacent to at least a portion of the additional region.

4. The device of claim 2, further comprising: a drain region immediately adjacent to the first well region and electrically isolated from the first gate section;
    and a source region immediately adjacent to the second well region and electrically isolated from the second gate section.

5. The device of claim 4, wherein the isolation structure is further positioned laterally between the first gate section and the drain region and extends into the first well region within the semiconductor layer.

6. The device of claim 1, wherein the first gate dielectric layer includes an insulator layer, and wherein the first gate conductor layer includes a monocrystalline semiconductor layer.

7. The device of claim 1, wherein the second gate dielectric layer includes a high-K gate dielectric layer, and wherein the second gate conductor layer includes a metallic gate conductor layer.

8. The device of claim 1, wherein the second gate conductor layer includes a polycrystalline semiconductor layer.

9. The device of claim 1, further comprising metal silicide layers on the first gate section and the second gate section.

10. The device of claim 1, further comprising a shared gate contact extending to the first gate section and the second gate section, wherein the shared gate contact is offset from an active device region.

11. The device of claim 1, further comprising: a first gate contact extending to the first gate section; and a second gate contact extending to the second gate section, wherein the first gate contact and the second gate contact are offset from an active device region.

12. The device of claim 11, wherein the first gate contact and the second gate contact are electrically connected to a same gate bias voltage source.

13. The device of claim 11, wherein the first gate contact and the second gate contact are electrically connected to different gate bias voltage sources.

14. A device comprising:
a semiconductor layer;
a gate including:
a first gate section including: a first gate dielectric layer on the semiconductor layer; a first gate conductor layer on the first gate dielectric layer; and an additional gate conductor layer on the first gate conductor layer; and
a second gate section including: a second gate dielectric layer on the semiconductor layer and further extending onto the first gate conductor layer, and a second gate conductor layer on the second gate dielectric layer, wherein the second gate dielectric layer is thinner than the first gate dielectric layer;
a gate sidewall spacer on the first gate conductor layer of the first gate section and positioned laterally between the second gate dielectric layer and the second gate conductor layer of the second gate section and the additional gate conductor layer of the first gate section; and
an isolation structure positioned laterally immediately adjacent to the first gate dielectric layer and the first gate conductor layer of the first gate section opposite a lower portion of the second gate section, wherein the isolation structure extends into the semiconductor layer.

15. The device of claim 14, further comprising:
a first well region within the semiconductor layer; and
a second well region within the semiconductor layer positioned laterally adjacent to the first well region and having a different type conductivity than the first well region, wherein the first gate section is adjacent to the first well region and the second gate section is adjacent to the second well region.

16. The device of claim 15,
wherein the first well region and the second well region are separated by an area of the semiconductor layer having a same type conductivity as the second well region at a lower conductivity level, and
wherein at least the first gate section is adjacent to at least a portion of the area.

17. The device of claim 15, further comprising: a drain region adjacent to the first well region and electrically isolated from the first gate section; and a source region adjacent to the second well region and electrically isolated from the second gate section.

18. The device of claim 17, wherein the isolation structure is further positioned laterally between the first gate section and the drain region and extends into the first well region within the semiconductor layer, and
wherein the device further comprises an additional gate sidewall spacer on the isolation structure positioned laterally adjacent to the additional gate conductor layer.

19. The device of claim 14, wherein the first gate dielectric layer includes an insulator layer, wherein the first gate conductor layer includes a monocrystalline semiconductor layer, and wherein the additional gate conductor layer includes an additional monocrystalline semiconductor layer.

20. A method including:
providing a semiconductor layer; and
forming a device including:
a gate including:
a first gate section including: a first gate dielectric layer on the semiconductor layer; and a first gate conductor layer on the first gate dielectric layer; and
a second gate section including: a second gate dielectric layer on the semiconductor layer and further extending onto the first gate conductor layer; and a second gate conductor layer on the second gate dielectric layer, wherein the second gate dielectric layer is thinner than the first gate dielectric layer;
a gate sidewall spacer on the first gate conductor layer of the first gate section and positioned laterally adjacent the second gate dielectric layer and the second gate conductor layer of the second gate section; and
an isolation structure positioned laterally immediately adjacent to the first gate dielectric layer and the first gate conductor layer of the first gate section opposite a lower portion of the second gate section, wherein the isolation structure extends into the semiconductor layer.

* * * * *